US011594635B2

(12) United States Patent
Chang et al.

(10) Patent No.: US 11,594,635 B2
(45) Date of Patent: Feb. 28, 2023

(54) EMBEDDED SOURCE OR DRAIN REGION OF TRANSISTOR WITH DOWNWARD TAPERED REGION UNDER FACET REGION

(71) Applicant: TAIWAN SEMICONDUCTOR MANUFACTURING COMPANY LTD., Hsinchu (TW)

(72) Inventors: Che-Cheng Chang, New Taipei (TW); Tung-Wen Cheng, New Taipei (TW); Zhe-Hao Zhang, Hsinchu (TW); Yung Jung Chang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 21 days.

(21) Appl. No.: 17/067,107

(22) Filed: Oct. 9, 2020

(65) Prior Publication Data
US 2021/0036155 A1 Feb. 4, 2021

Related U.S. Application Data

(60) Continuation of application No. 16/451,914, filed on Jun. 25, 2019, now Pat. No. 10,804,396, which is a
(Continued)

(51) Int. Cl.
*H01L 29/66* (2006.01)
*H01L 29/78* (2006.01)

(52) U.S. Cl.
CPC .... *H01L 29/7848* (2013.01); *H01L 29/66545* (2013.01); *H01L 29/66795* (2013.01); *H01L 29/785* (2013.01)

(58) Field of Classification Search
CPC .......... H01L 29/7851; H01L 29/66795; H01L 29/7848
(Continued)

(56) References Cited

U.S. PATENT DOCUMENTS

2008/0057634 A1* 3/2008 Lee ................... H01L 29/66795
257/E21.409
2008/0121970 A1* 5/2008 Aritome ............ H01L 29/40114
438/257
(Continued)

FOREIGN PATENT DOCUMENTS

JP 2009200225 A 9/2009

OTHER PUBLICATIONS

Office Action, Cited References dated Dec. 19, 2022 issued by the Germany Intellectual Property Office for the Germany Counterpart Application No. 10 2014 019 601.1.

*Primary Examiner* — Phuc T Dang
(74) *Attorney, Agent, or Firm* — WPAT Law; Anthony King

(57) ABSTRACT

In some embodiments, a field effect transistor (FET) structure comprises a body structure, dielectric structures, a gate structure and a source or drain region. The gate structure is formed over the body structure. The source or drain region is embedded in the body structure beside the gate structure, and abuts and is extended beyond the dielectric structure. The source or drain region contains stressor material with a lattice constant different from that of the body structure. The source or drain region comprises a first region formed above a first level at a top of the dielectric structures and a second region that comprises downward tapered side walls formed under the first level and abutting the corresponding dielectric structures.

20 Claims, 38 Drawing Sheets

Related U.S. Application Data continuation of application No. 15/854,480, filed on Dec. 26, 2017, now Pat. No. 10,340,382, which is a division of application No. 14/449,572, filed on Aug. 1, 2014, now Pat. No. 9,853,154, which is a continuation-in-part of application No. 14/163,391, filed on Jan. 24, 2014, now Pat. No. 10,164,107.

(58) Field of Classification Search
USPC .............................................. 257/173, 192
See application file for complete search history.

(56) References Cited

U.S. PATENT DOCUMENTS

| | | |
|---|---|---|
| 2009/0280627 A1 | 11/2009 | Pal et al. |
| 2011/0147810 A1 | 6/2011 | Hsu et al. |
| 2012/0100681 A1 | 4/2012 | Fang et al. |
| 2012/0153387 A1 | 6/2012 | Murthy et al. |
| 2013/0285123 A1 | 10/2013 | Adam et al. |
| 2014/0191297 A1* | 7/2014 | Utomo ................ H01L 29/7855 257/288 |
| 2015/0035018 A1* | 2/2015 | Liu ..................... H01L 29/0847 257/288 |

* cited by examiner

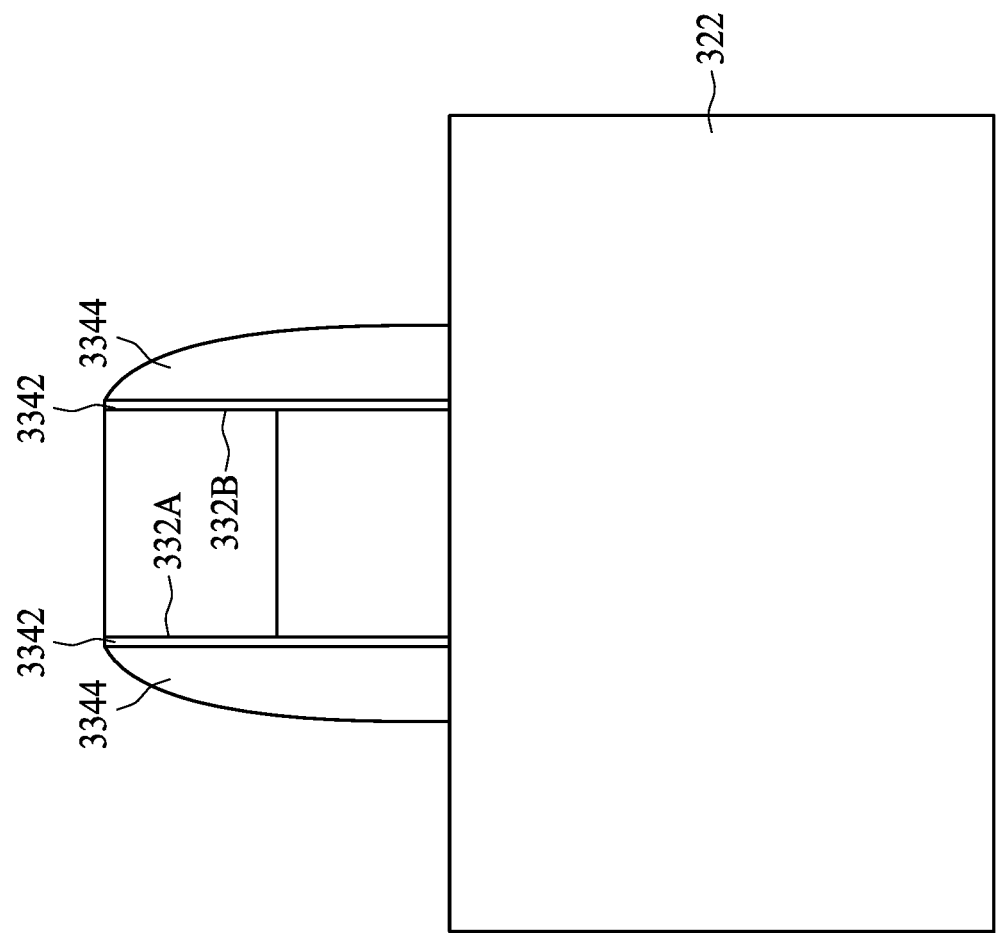

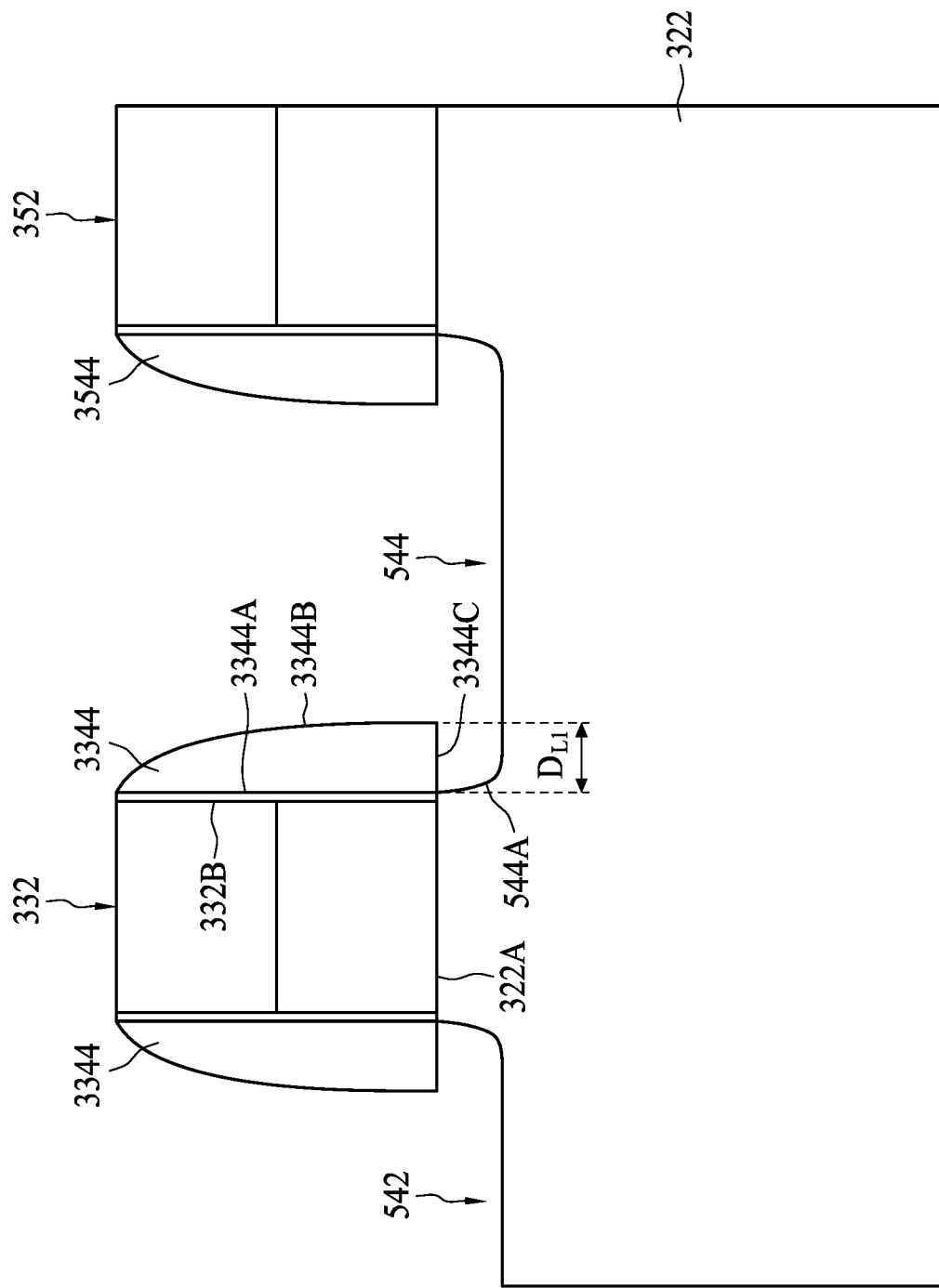

EMBEDDED SOURCE OR DRAIN REGION OF TRANSISTOR WITH DOWNWARD TAPERED REGION UNDER FACET REGION

PRIORITY CLAIM AND CROSS-REFERENCE

This application is a continuation of application Ser. No. 16/451,914, filed on Jun. 25, 2019, which is a continuation of application Ser. No. 15/854,480, filed on Dec. 26, 2017, which is a division of application Ser. No. 14/449,572, filed on Aug. 1, 2014, which is a Continuation-in-Part (CIP) application of U.S. application Ser. No. 14/163,391 filed on Jan. 24, 2014. All of the above-referenced applications are hereby incorporated herein by reference in their entirety.

BACKGROUND

Field effect transistors (FETs) introduced with mechanical stress applied to channel regions have enhanced driving strength due to increased carrier mobility in the channel regions. In some approaches, in an FET, source and drain regions on opposite sides of a gate include stressor regions embedded in a body structure. Lattice mismatch between the material of a channel region and the material of the embedded stressor regions causes mechanical stress applied to the channel region. The magnitude of the mechanical stress is dependent on the proximity of the embedded stressor regions to the channel region, and the volumes of the embedded stressor regions. However, when forming recesses in the body of the FET in which the stressor material is to be grown, the profiles of the recesses is dependent on a loading effect of neighboring geometry which can vary from a FET to FET, thereby resulting in non-uniformity of device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a schematic cross-sectional diagram illustrating spacers formed over the gate side walls in accordance with some embodiments.

FIGS. 5 to 8 are schematic cross-sectional diagrams illustrating the formation of the source or drain region and the shared source or drain region in accordance with some embodiments.

DETAILED DESCRIPTION

Figure 1A:
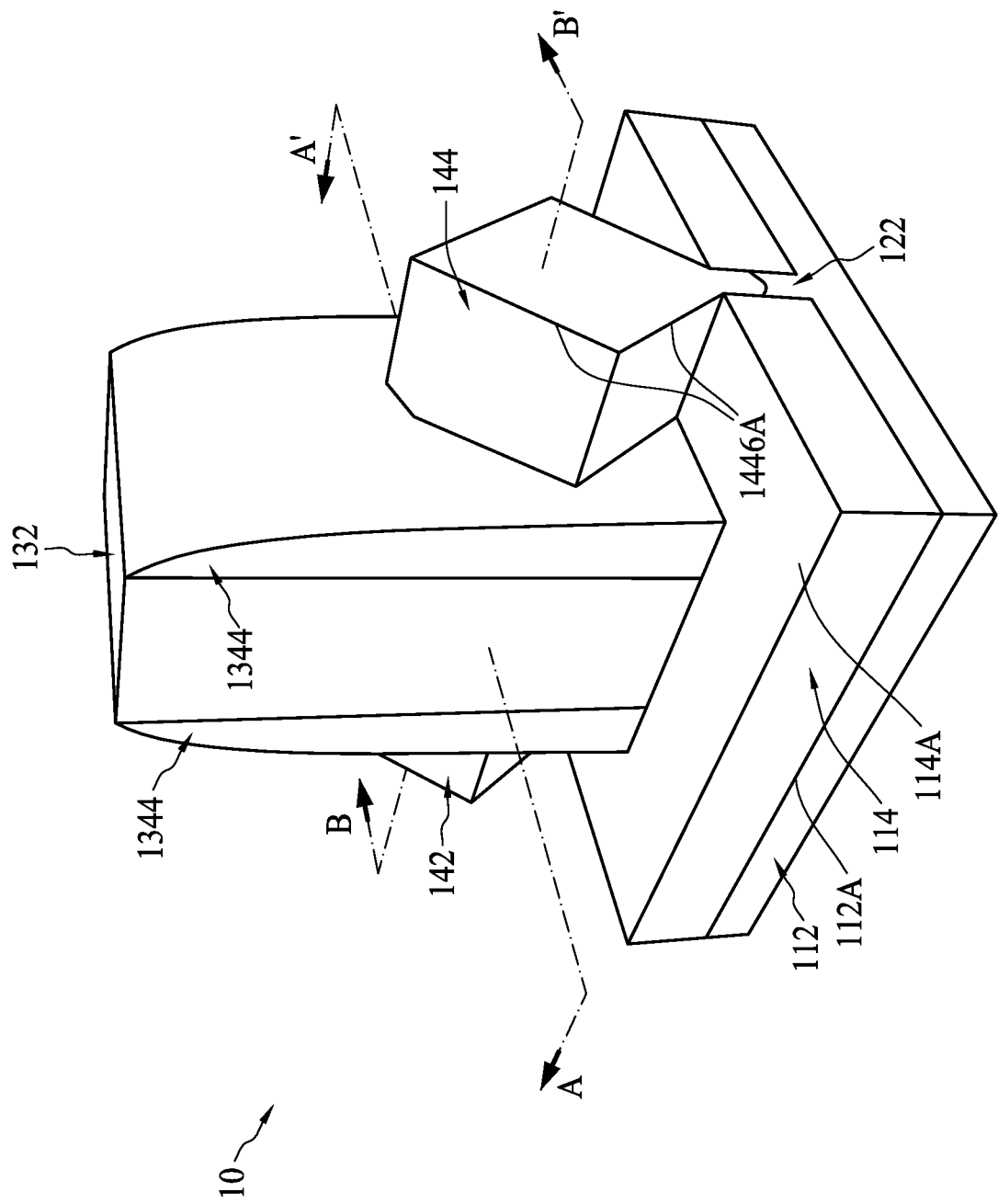
FIG. 1A is a schematic perspective diagram of a FinFET structure having source and drain regions containing epitaxially grown stressor material in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top", "bottom", "upward", "downward", "front", "back", "left", "right", "horizontal", "vertical" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Figure 1B:
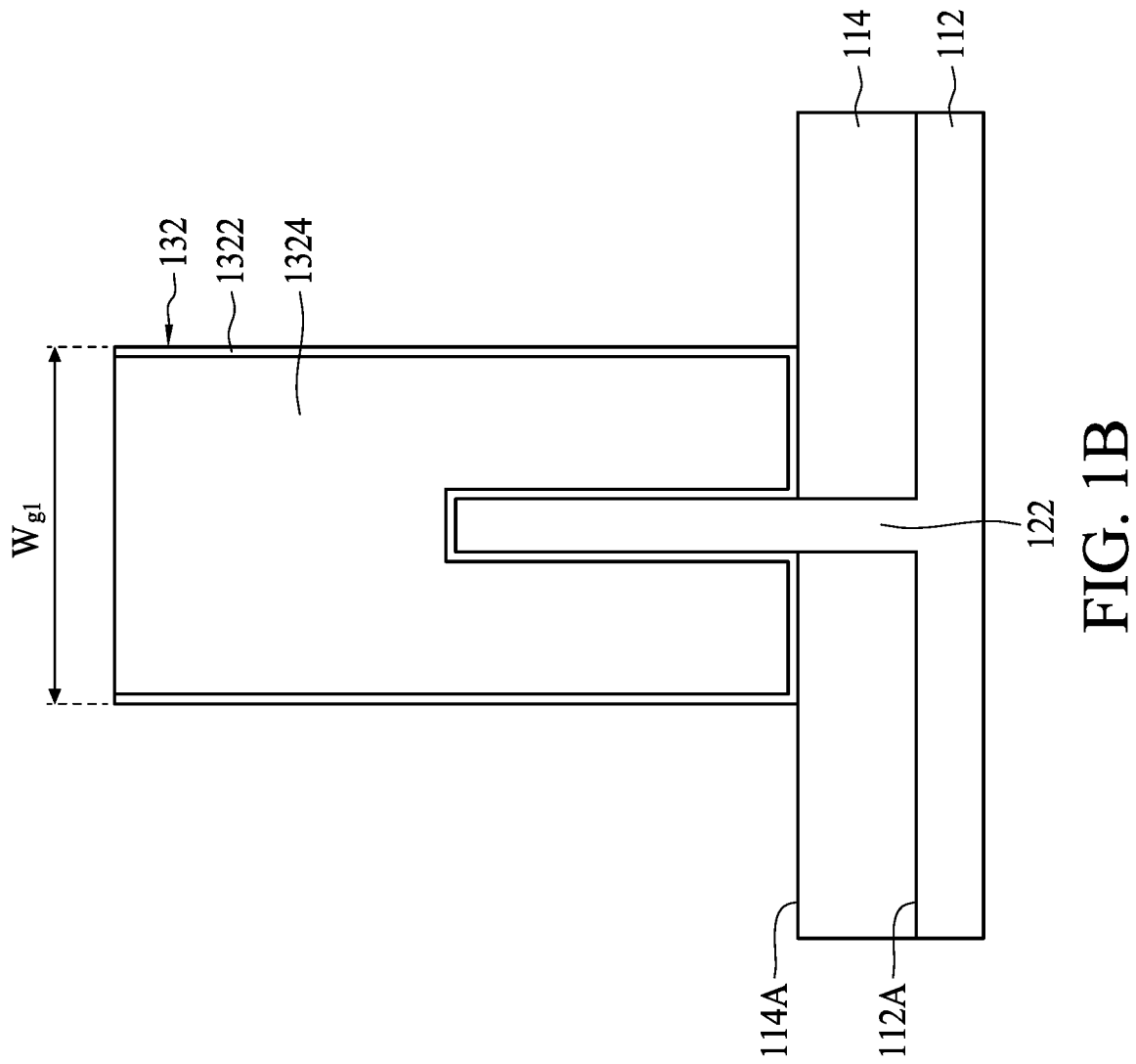
FIGS. 1B and 1C are schematic cross-sectional diagrams along a line A-A' and a line B-B' in FIG. 1A, respectively, in accordance with some embodiments.
Figure 1C:
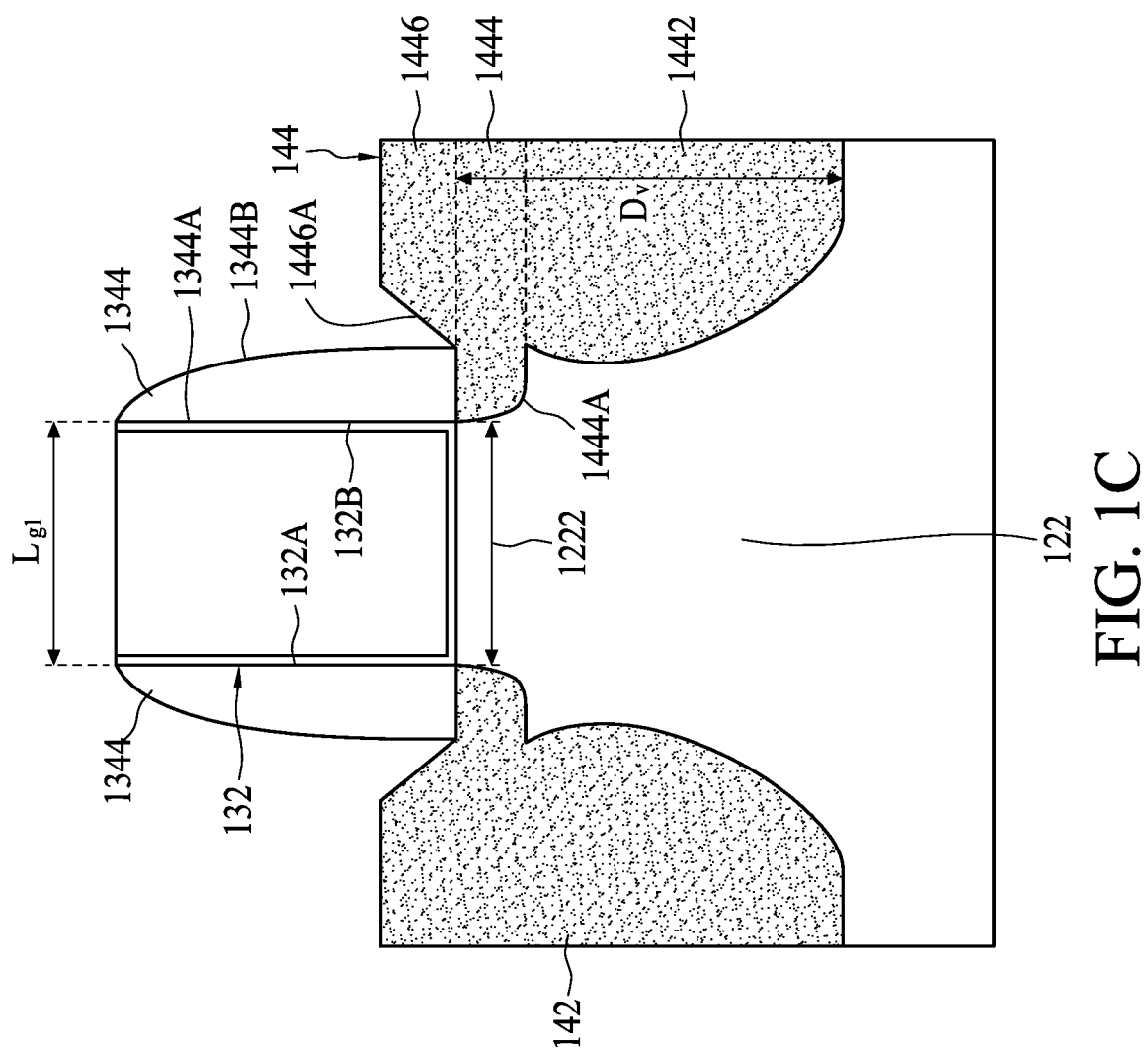

Embedded Source or Drain Region with Laterally Extended Portion Under Gate Spacer FIG. 1A is a schematic perspective diagram of a FinFET structure 10 having source and drain regions 142 and 144 containing epitaxially grown stressor material in accordance with some embodiments. FIGS. 1B and 1C are schematic cross-sectional diagrams along a line A-A' and a line B-B' in FIG. 1A, respectively, in accordance with some embodiments. FIG. 1A illustrates relative orientations of the substrate 112, a body structure 122, a gate structure 132 and the source and drain regions 142 and 144 in the FinFET structure 10. FIG. 1B illustrates the cross-section of the body structure 122 along a width $W_{g1}$ of the gate structure 132. FIG. 1C illustrates a cross-section of the source and drain regions 142 and 144 and the body structure 122 along a length $L_{g1}$ of the gate structure 132.

Referring to FIG. 1A, the FinFET structure 10 includes a substrate 112, the body structure 122, dielectric isolation regions 114, the gate structure 132 with spacers 1344, and source and drain regions 142 and 144. In some embodiments, the substrate 112 is a bulk semiconductor substrate in a crystalline structure, such as a bulk silicon substrate. The substrate 112 has a top surface 112A (labeled at the level of the top surface).

In some embodiments, the body structure 122 includes a fin structure protruding from the surface 112A of the substrate 112. Referring to FIG. 1B, in some embodiments, the cross section of the body structure 122 along the width $W_{g1}$ of the gate structure 132 has a vertical profile from the surface 112A to the top of the body structure 122. The vertical profile of the body structure 122 is exemplary. For example, the cross section of the body structure 122 along the width $W_{g1}$ of the gate structure 132 can have a tapered profile from the surface 112A to the top surfaces 114A of the dielectric isolation region 114, or a tapered profile from the surface 112A to the top of the body structure 122. In some embodiments, the body structure 122 has the same material as the substrate 112 and has, for example, the crystalline structure of silicon.

Referring to FIG. 1A, in some embodiments, dielectric isolation regions 114 such as shallow trench isolations (STIs) are formed on the surface 112A of the substrate 112 and surrounding the body structure 122. The dielectric isolation regions 114 have top surfaces 114A. Referring to FIG. 1B, the body structure 122 extends above the top surfaces 114A of the dielectric isolation regions 114. In some embodiments, the dielectric isolation regions 114 includes silicon oxide, silicon nitride, silicon oxy-nitride, fluoride-doped silicate (FSG), and/or a suitable low-k dielectric material.

Referring to FIG. 1A, in some embodiments, the gate structure 132 is formed on the top surfaces 114A of the dielectric isolation regions 114 and traverses a portion of the body structure 122. Referring to FIG. 1B, along the width $W_{g1}$ of the gate structure 132, the gate structure 132 traverses the body structure 122 and wraps around the body structure 122. In some embodiments, the gate structure 132 includes a gate dielectric layer 1322 which wraps around the body structure 122 conformally, and a gate electrode 1324 that caps over the gate dielectric layer 1322. In some embodiments, the gate dielectric layer 1322 includes a high-k dielectric material such as $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O$, SrTiO, or combinations thereof. In some embodiments, the gate electrode 1324 includes work function metal layers which are conformally formed over the gate dielectric layer 1322 for adjusting a work function of the gate electrode 1324, and a fill metal that caps over the work function metal layers serving as the main conductive portion of the gate electrode 1324. Examples of work function metal layers include TaC, TaN, TiN, TaAlN, TaSiN, and combinations thereof. Examples of fill metal includes W, Al, Cu, and combinations thereof. The layers in the gate structure 132 are exemplary. The gate structure 132 with, for example, other layers, other coverage of the layers, different numbers of the layers are within the contemplated scope of the present disclosure.

Referring to FIG. 1A, in some embodiments, the source and drain regions 142 and 144 on opposite sides of the gate structure 132 includes epitaxially grown stressor material. Referring to FIG. 1C, the gate structure 132 has opposite side walls 132A and 132B across the gate length $L_{g1}$ of the gate structure 132. The spacers 1344 are formed on the side walls 132A and 132B of the gate structure 132. The source and drain regions 142 and 144 are configured beside the spacers 1344 and have regions that are embedded in the body structure 122, such as a region 1442 and a region 1444, and a region beyond the body structure 122, such as regions 1446. In some embodiments, the region 1444 extends laterally under the spacer 1344, and the region 1442 is located under the region 1444 and extends the vertical depth of the region 1444 so that the region 1442 and the region 1444 has a total vertical depth $D_v$. In some embodiments, the region 1444 protrudes laterally from the region 1442. In some embodiments, the region 1444 of has a wall section 1444A under the spacer 1344. The wall section 1444A tapers towards a plane in the body structure 122 substantially aligned with the gate side wall 132B from a bottom of the wall section 1444A to a top of the wall section 1444A. The bottom of the wall section 1444A is substantially aligned or more closely aligned with a side wall 1344B of the spacer 1344, and the top of the wall section 1444A is substantially aligned or more closely aligned with a side wall 1344A of the spacer 1344. In the embodiments illustrated in FIG. 1C, the side wall 1344A of the spacer 1344 coincide with the gate side wall 132B. In other embodiments to be described with reference to FIG. 5, the side wall 3344A of the spacer 3344 does not coincide with the gate side wall 332B. The plane in the body structure 122 substantially aligned with the gate side wall 132B is considered as one end of a channel region 1222 under the gate structure 132. In some embodiments, the wall section 1444A has a round profile. In some embodiments, the region 1442 has an elliptical-shaped profile. In some embodiments, the region 1446 beyond the body structure 122 have facets 1446A (also labeled in FIG. 1A). In the beginning of the epitaxial growth of the source and drain regions 142 and 144, facets may not be fully established. However, with the proceeding of the epitaxial growth, due to different epitaxial growth rates on different surface planes, facets are gradually formed.

In some embodiments, the stressor material grown in the source and drain regions 142 and 144 has a lattice constant different from that of the body structure 122. In some embodiments, the FinFET structure 10 (labeled in FIG. 1A) is a p-type FET, and the stressor material grown in the source and drain regions 142 and 144 has a lattice constant larger than that of the body structure 122 to apply a compressive stress on the channel region 1222 in the body structure 122. In some embodiments, the body structure 122 is made of silicon (Si), and the stressor material is silicon germanium (SiGe). In other embodiments, the FinFET structure 10 is an n-type FET, and the stressor material grown in the source and drain regions 142 and 144 has a lattice constant smaller than that of the body structure 122 to apply a tensile stress on the channel region 1222 in the body structure 122. In some embodiments, the body structure 122 is made of Si, and the stressor material is silicon phosphide (Si: P) or silicon carbide (Si: C).

A distance between, for example, the source or drain region 144 embedded in the body structure 122 and the gate side wall 132B is defined as a proximity of the source or drain region 144 to the channel region 1222 under the gate structure 132. The closer the proximity of the source or drain region 144 to the channel region 1222 is, the greater the mechanical stress to the channel region 1222 is, and the higher the carrier mobility enhancement is. By forming the region 1444 extended laterally under the spacer 1344, the proximity of the source or drain region 144 to the channel region 1222 under the gate structure 132 is improved. Further, the mechanical stress applied to the channel region 1222 is dependent on the volume of the source or drain region 144, which depends on the total vertical depth $D_v$ of the region 1442 and the region 1444. By forming distinct regions 1444 and 1442 for enhancing the proximity effect and the volume effect, respectively, the optimization of the processes for forming the regions 1444 and 1442 can be separated.

Figure 2:
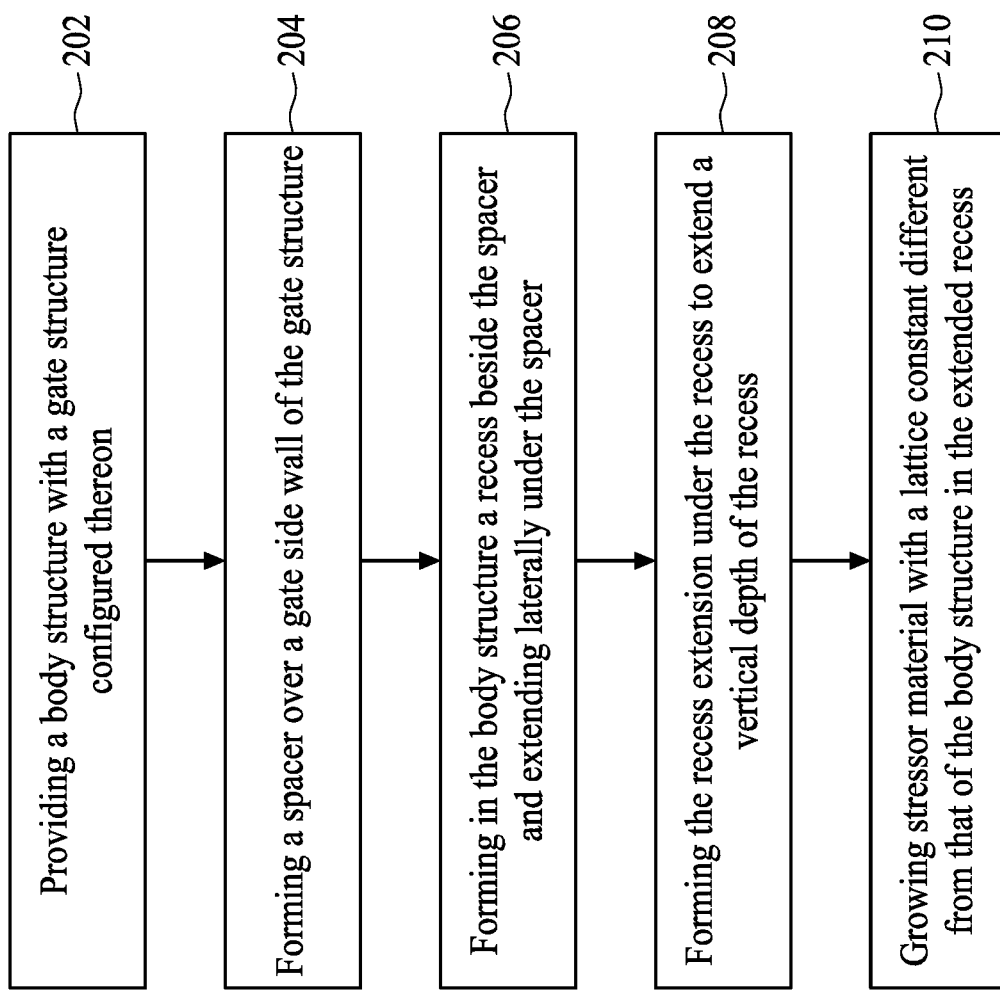
FIG. 2 is a flow chart of a method for forming an FET structure with source and drain regions containing epitaxially grown stressor material in accordance with some embodiments.

FIG. 2 is a flow chart of a method 200 for forming an FET structure with source and drain regions containing epitaxially grown stressor material in accordance with some embodiments. In operation 202, a body structure with a gate structure configured thereon is provided. In operation 204, a spacer is formed over a gate side wall of the gate structure. In operation 206, a recess beside the spacer and extended laterally under the spacer is formed in the body structure. In operation 208, a recess extension is formed under the recess to extend a vertical depth of the recess. In operation 210, stressor material with a lattice constant different from that of the body structure is grown in the extended recess.

FIGS. 3 to 11 are schematic diagrams illustrating semiconductor structures after each operation of a method for forming the FinFET structure 10 in FIG. 1A in accordance with some embodiments. The method illustrated in FIGS. 3 to 11 provides further details to the method described with reference to FIG. 2. In operation 202, a body structure with a gate structure configured thereon is provided. FIG. 3A is a schematic perspective diagram of a semiconductor structure 30 with a sacrificial gate structure 332 straddling a body structure 322 implemented as a fin in accordance with some embodiments. In some embodiments, the body structure 322 protruding from a surface 112A of a substrate 112 is formed by etching trenches in a bulk semiconductor substrate. The surface 112A is located at a level of the bottom surfaces of the trenches. Between the trenches is the body structure 322 extending from the surface 112A of the substrate 112. Further, the trenches are filled with dielectric material as described with references to FIGS. 1A and 1B to form the dielectric isolation regions 114. In some embodiments, the dielectric isolation regions 114 are further etched so that the body structure 322 extends beyond the top surfaces 114A of the dielectric isolation regions 114. In other embodiments, the portion of the body structure 122 extended beyond the top surfaces 114A of the dielectric isolation regions 114 is epitaxially grown.

Figure 3A:
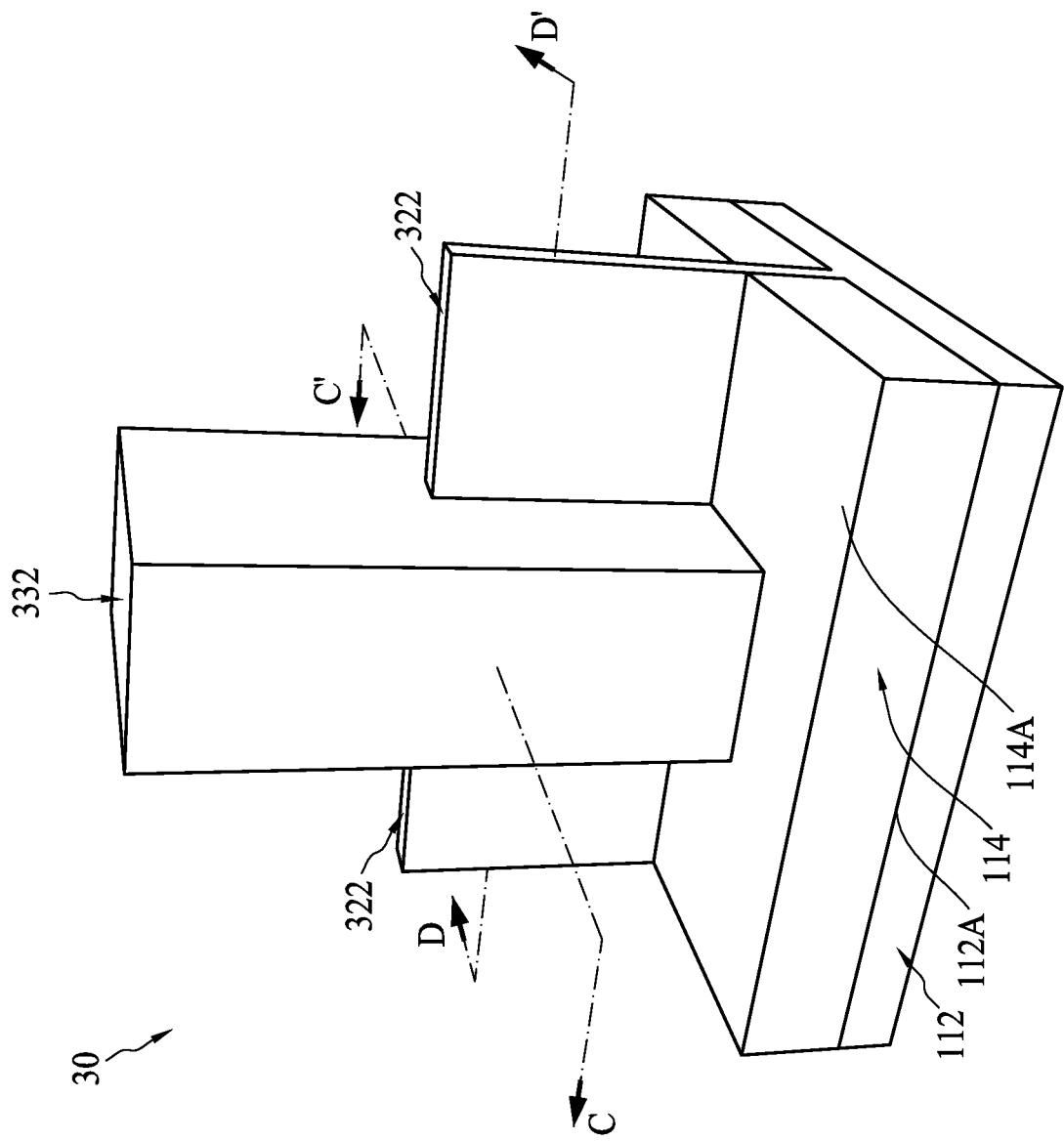
FIG. 3A is a schematic perspective diagram of a semiconductor structure with a sacrificial gate structure straddling a body structure implemented as a fin in accordance with some embodiments.
Figure 3B:
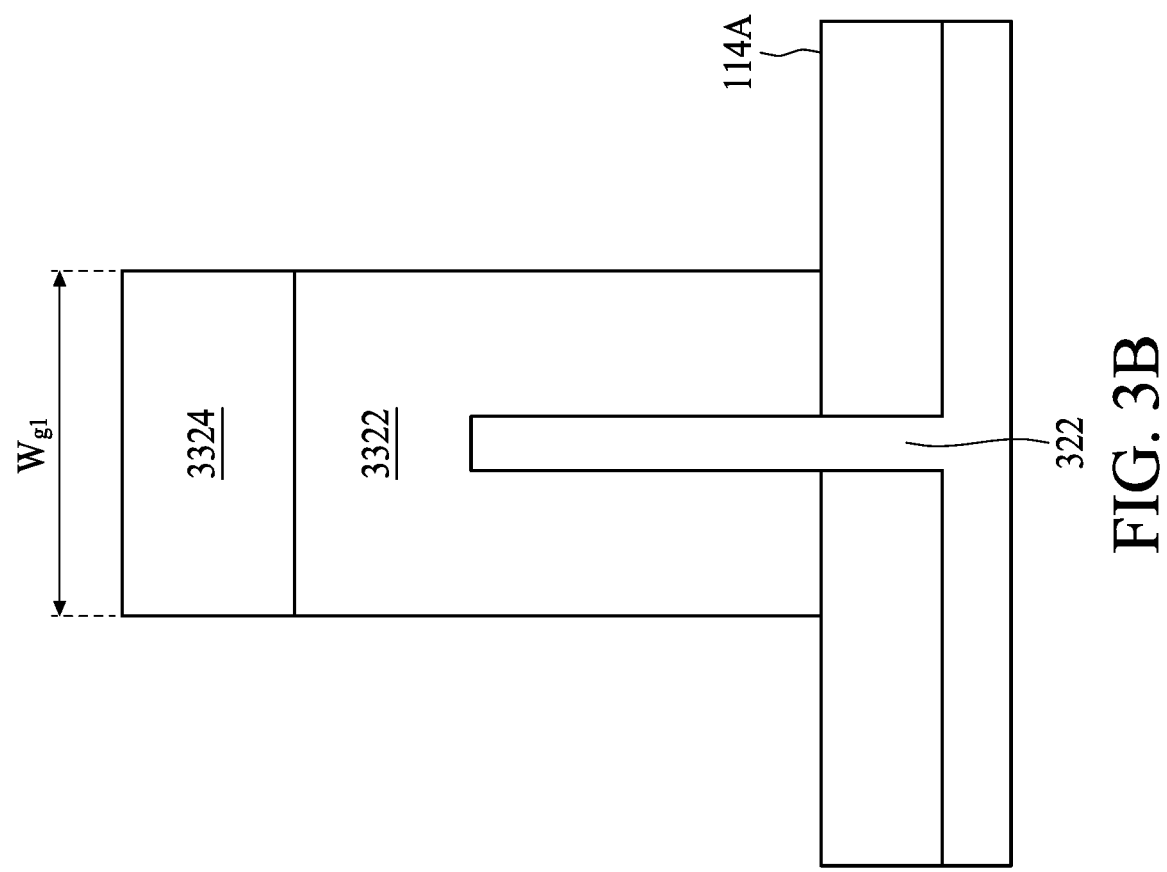
FIGS. 3B and 3C are schematic cross-sectional diagrams along a line C-C' and a line D-D' in FIG. 3A in accordance with some embodiments.
Figure 3C:
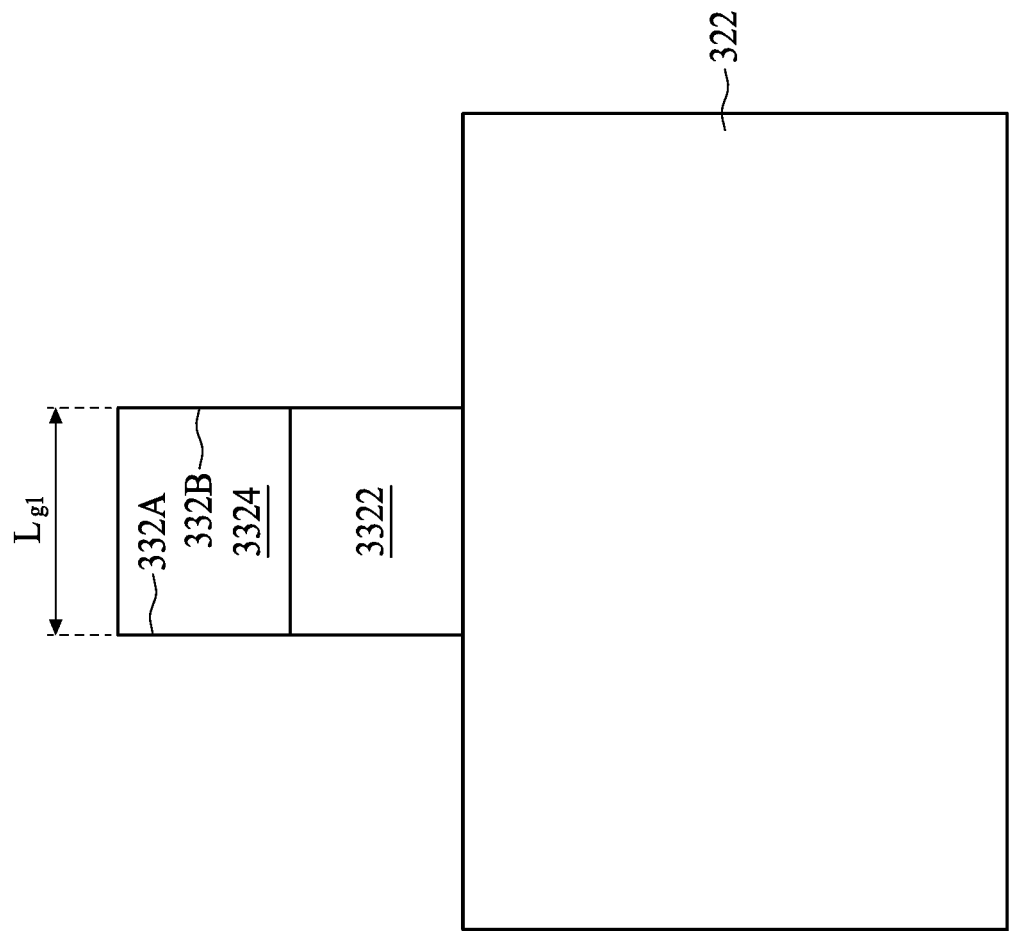

FIGS. 3B and 3C are a schematic cross-sectional diagrams along a line C-C' and a line D-D' in FIG. 3A in accordance with some embodiments. In some embodiments, for forming the sacrificial gate structure 332 straddling the body structure 322 in FIG. 3A, a sacrificial gate layer to be patterned into a sacrificial gate electrode 3322 illustrated in FIGS. 3B and 3C is blanket deposited over the surface 114A (shown in FIG. 3B) and a portion of the exposed surfaces of the body structure 322 (shown in both FIGS. 3B and 3C). In other embodiments, a sacrificial gate dielectric layer (not shown) is formed between the sacrificial gate layer and the body structure 322 to protect the body structure 322 when the sacrificial gate layer is being patterned to form the sacrificial gate electrode 3322. Further, one or more hard mask layers are formed on the sacrificial gate layer, and a photoresist layer is formed on the one or more hard mask layers. The layers for forming the sacrificial gate structure 332 can be deposited using any of the methods such as physical vapor deposition (PVD), plasma-enhanced chemical vapor deposition (PECVD), chemical vapor deposition (CVD), atomic layer deposition (ALD) or other methods deemed appropriate by those skilled in the art. Photolithography techniques are used to pattern the photoresist layer into a photoresist mask which defines an area where the sacrificial gate structure 332 (labeled in FIG. 3A) is desired. The area of the sacrificial gate structure 332 has a gate width $W_{g1}$ (shown in FIG. 3B) and a gate length $L_{g1}$ (shown in FIG. 3C). The pattern of the photoresist mask is then transferred to the one or more hard mask layers to form the hard mask 3324 (shown in both FIGS. 3B and 3C) which will not be significantly etched or eroded during patterning the sacrificial gate layer. Further, the pattern of the hard mask 3324 is transferred to the sacrificial gate layer to form a sacrificial gate electrode 3322. The transferring of the pattern from the photoresist mask to the underlying layers is performed by anisotropic etching using suitable etching gases. Referring to FIG. 3C, the sacrificial gate structure 332 has vertical gate side walls 332A and 332B across the gate length $L_{g1}$. In some embodiments, the sacrificial gate electrode 3322 is formed of polysilicon, and the hard mask 3324 includes $SiO_2$, $Si_3N_4$, or SiON. In other embodiments, the sacrificial gate electrode 3322 is formed of $Si_3N_4$ and the hard mask 3324 includes $SiO_2$, or SiON.

FIG. 4 to FIG. 11 are cross-sectional diagrams along the gate length $L_{g1}$ (labeled in FIG. 3C). In operation 204, a spacer is formed over a gate side wall of the gate structure. FIG. 4 illustrates spacers 3344 formed over the gate side walls 332A and 332B in accordance with some embodiments. In some embodiments, a sealing layer 3342 is formed on gate side walls, including the gate side walls 332A and 332B, surrounding the sacrificial gate structure 332 (labeled in FIG. 3A). The sealing layer 3342 protects the sacrificial gate structure 332 from damage or loss during subsequent processing. In some embodiments, the sealing layer includes $Si_3N_4$. Subsequently, in some embodiments, the spacers 3344 are formed on the sealing layer 3342. The spacers 3344 are used to control the offsets of the source and drain regions 142 and 144 (shown in FIG. 1C) to the sacrificial gate structure 332 in order to obtain device performance without production issues. Each spacer 3344 can include one or more layers. In some embodiments, the spacers 3344 includes $Si_3N_4$, SiON, SiOCN, SiCN, or $SiO_2$. The sealing layer 3342 and the spacers 3344 can be deposited using any of the methods such as PVD, PECVD, CVD, ALD or other methods deemed appropriate by those skilled in the art. In other embodiments as illustrated in FIG. 1, the sealing layer 3342 is not formed, and the spacers 1344 also serve to seal the gate structure 132.

Figure 6:
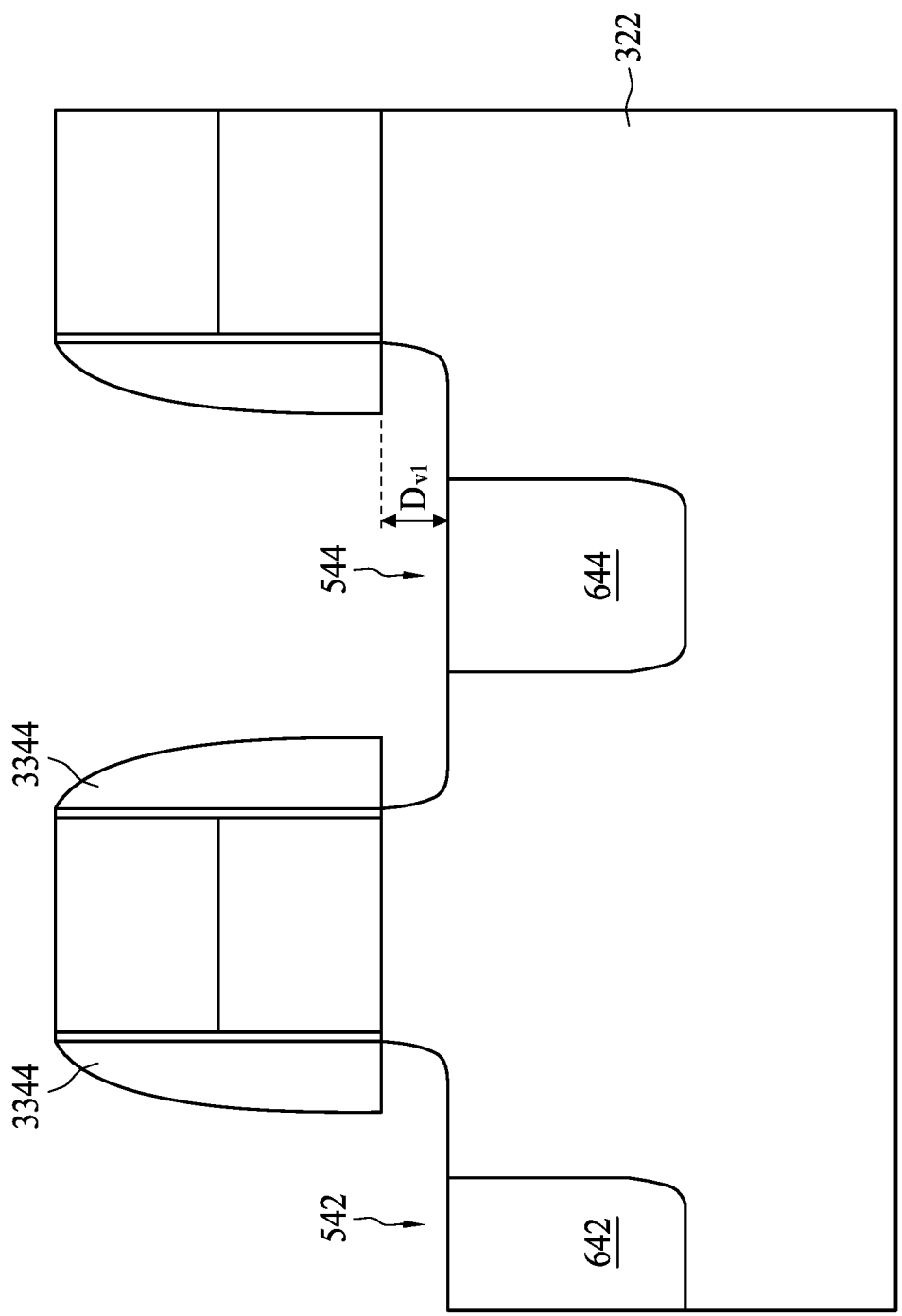
Figure 7:
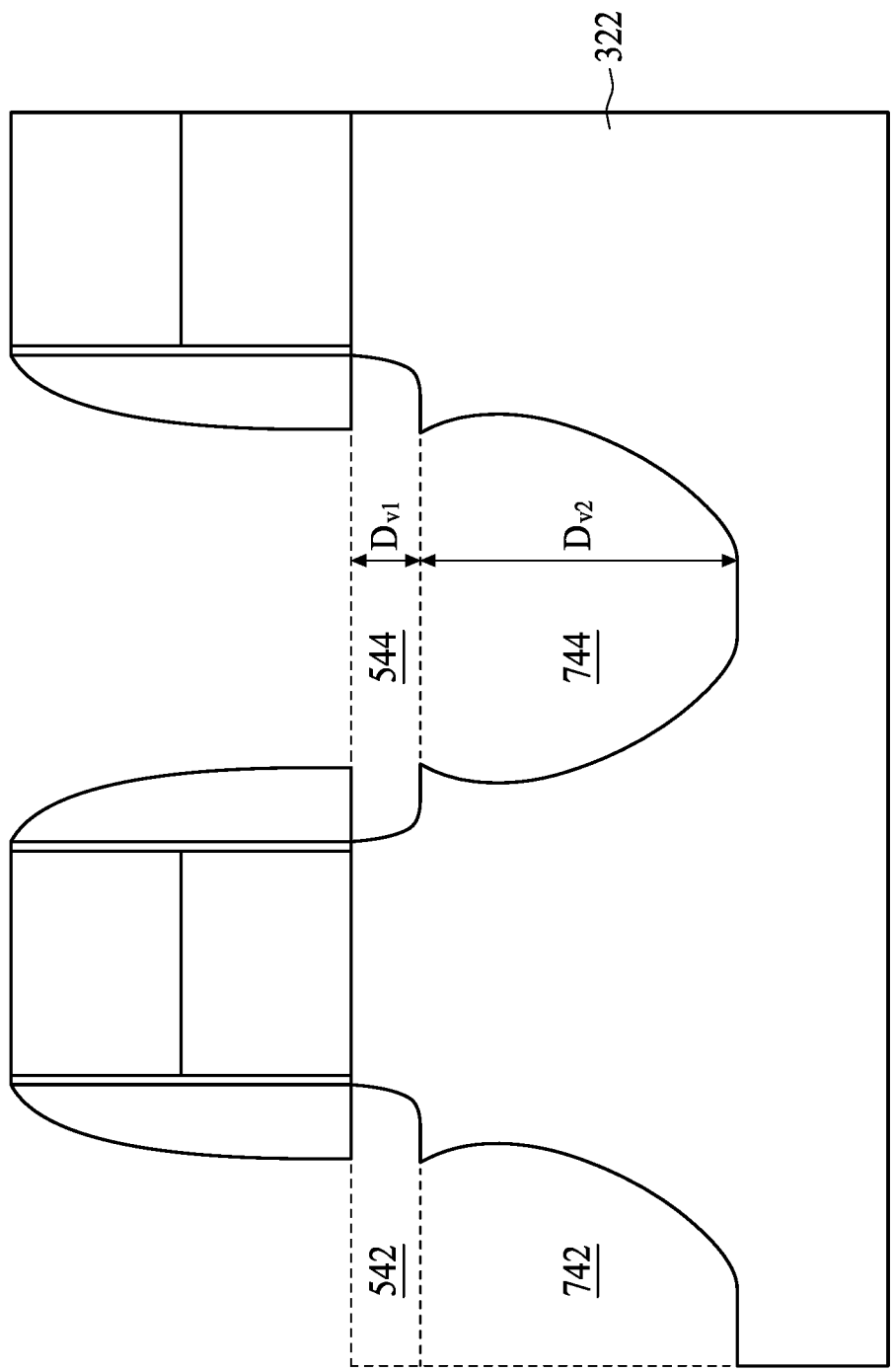
Figure 8:
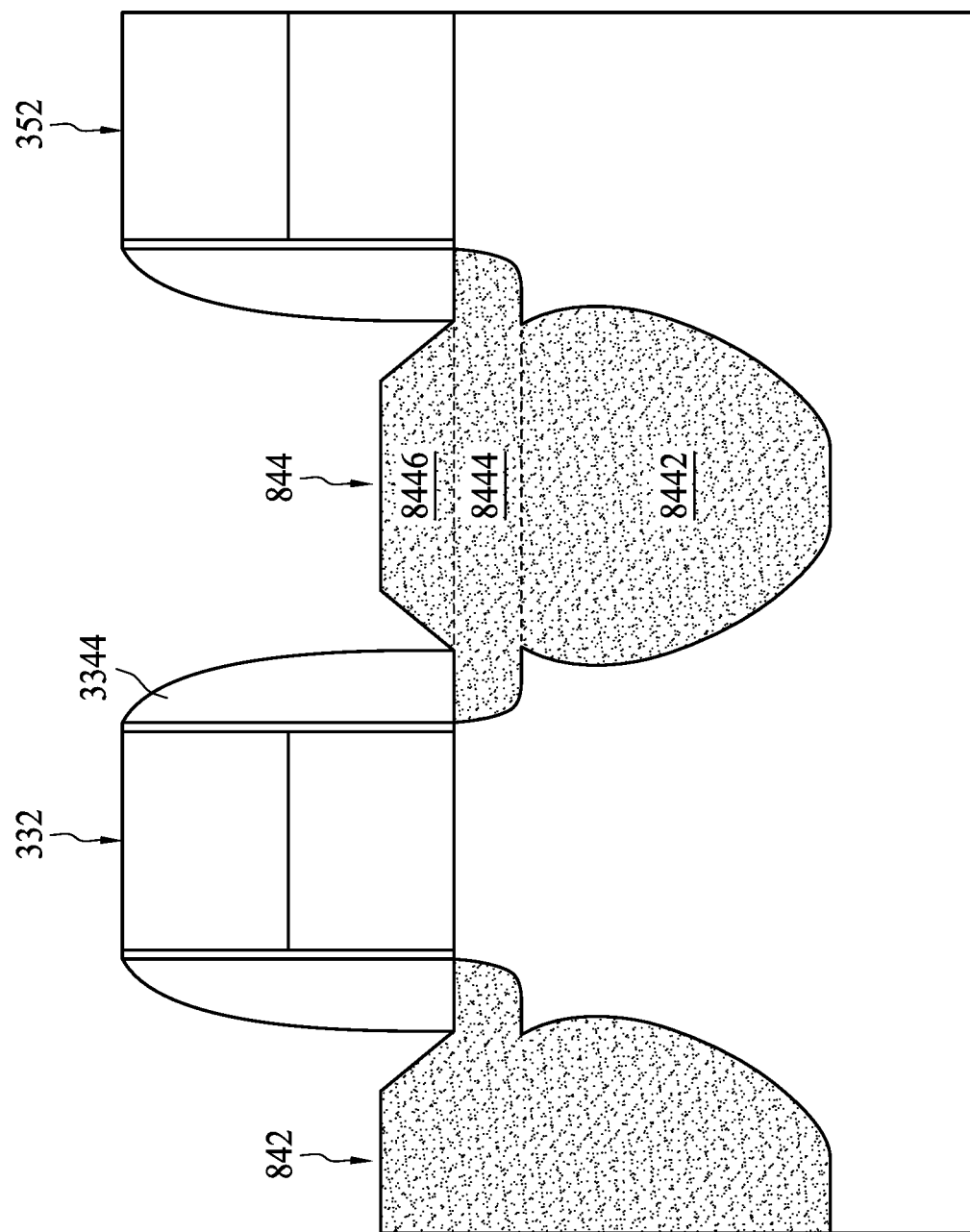

In some embodiments, the sacrificial gate structure 332 has a shared source or drain region 844 with an adjacent gate structure 352, as illustrated in FIG. 8. FIGS. 5 to 8 illustrate the formation of the source or drain region 842 and the shared source or drain region 844 in accordance with some embodiments. Because the formation of the shared source or drain region 844 is dependent on both the sacrificial gate structure 332 and the adjacent gate structure 352, the shared source or drain region 844 has a symmetrical profile. Nevertheless, the operations described with reference to FIGS. 5 to 8 are also applicable to the formation of the FinFET structure 10 illustrated in FIG. 1. Moreover, the semiconductor structure with source and drain regions with asymmetrical profiles as illustrated in FIG. 1, and with one or both of the source and drain regions with symmetrical profiles as illustrated in FIG. 8 are within the contemplated scope of the present disclosure.

In operation 206, a recess beside the spacer and extended laterally under the spacer is formed in the body structure. Referring to FIG. 5, in some embodiments, recesses 542 and 544 are formed in the body structure 322 beside the spacers 3344. The recesses 542 and 544 extend laterally under the spacers 3344. In some embodiments, the recess 544 is formed between the sacrificial gate structure 332 and the adjacent gate structure 352, and also extends laterally under the spacer 3544 of the gate structure 352.

In some embodiments, the recesses 542 and 544 are formed by isotropic etching. In some embodiments, wet etching is used to perform the isotropic etching. Because portions of the recesses 542 and 544 extended laterally under the spacers 3344 and 3544 are similar or symmetrical, the portion of the recess 544 extended laterally under the spacer 3344 is used as an example for characterizing the profile of the recesses 542 and 544. The recess 544 has a lateral depth $D_{L1}$ under the spacer 3344. In some embodiments, the lateral depth $D_{L1}$ is within a range of a first distance between a side wall 3344A and a side wall 3344B of the spacer 3344 at a level of a top surface 322A of the body structure 322, and a second distance between the side wall 3344A and the gate side wall 332B at the level of the top surface 322A. In some embodiments, a surface 3344C of the spacer 3344 on the body structure 322 is exposed. In the embodiments shown in FIG. 5, the lateral depth $D_{L1}$ extends up to the side wall 3344A of the spacer 3344. In other embodiments to be described with reference to FIG. 12, the lateral depth $D_{L2}$ further extends beyond the side wall 3344A and up to the gate side wall 332B. In the embodiments described with reference to FIG. 1C, because a sealing layer is not formed between the gate structure 132 and the spacer 1344, the lateral depth extends up to the side wall 1344A which coincides with the gate side wall 132B.

In some embodiments, the recess 544 has a wall section 544A under the spacer 3344. The wall section 544A tapers toward a plane in the body structure 322 substantially aligned with the gate side wall 332B from a bottom of the wall section 544A to a top of the wall section 544A. The bottom of the wall section 544A is substantially aligned or more closely aligned with the side wall 3344B of the spacer 3344, and the top of the wall section 3344A is substantially aligned or more closely aligned with the side wall 3344A of the spacer 3344. In some embodiments, the wall section 544A under the surface 3344C exposed by the recess 544 tapers toward a plane in the body structure 322 substantially aligned with the gate side wall 332B along a direction of exposure of the surface 3344C of the spacer 3344. The direction of exposure of the surface 3344C of the spacer 3344 is along the direction of lateral etching of the recess 544. In some embodiments, at the level of the top surface 322A of the body structure 322, the wall section 544A is located within a region between the surface 3344C of the spacer 3344 and the gate side wall 332B.

In operation 208, a recess extension is formed under the recess to extend a vertical depth of the recess. Referring to FIG. 6, in some embodiments, to extend a vertical depth D of the recesses 542 and 544, etch rate control doping regions 642 and 644 are formed in the body structure 322. The doping regions 642 and 644 are formed beside the spacers 3344 and under the recesses 542 and 544, respectively. A dopant used in forming the doping regions 642 and 644 is chosen based on its ability to increase the etch rate of the body structure 322. The specific dopant used depends on the material of the body structure 322 and an etchant used in a subsequent etching to form the recess extension. In some embodiments, the dopant is arsenic (As), phosphorous (P), or other suitable material. In some embodiments, ion implantation is used to perform doping. In some embodiments, As is used at a dosage that ranges from $1 \times 10^{14}$ to $5 \times 10^{15}$ atoms/cm$^3$. In some embodiments, As is used at a dosage of $3 \times 10^{14}$ atoms/cm$^3$. In some embodiments, as is implanted at an ion energy of 2 to 10 keV.

Referring to FIG. 7, in some embodiments, etching of the body structure 322 is performed to form the recess extensions 742 and 744 with a vertical depth $D_{v2}$ so that an extended recess including the recess 542 or 544 and the recess extension 742 or 744 has a total vertical depth of $D_{v1}+D_{v2}$. In some embodiments, the etching of the body structure 322 to form the recess extensions 742 and 744 uses etchants that complements the dopant used in the doping operation to increase the etch rate of the doping regions 642 and 644. Therefore, the vertical depth of the doping regions 642 and 644 control the vertical depth $D_{v2}$ of the recess extensions 742 and 744. In some embodiments, etching of the body structure 33 to form the recess extensions 742 and 744 is performed using dry chemical etching such as plasma etching. In some embodiments, the recess extension 744 has a symmetrical and elliptical-shaped profile. In other words, a vertical etch rate of the recess extension 744 is higher than a lateral etch rate of the recess extension 744. The recess extension 742 has an asymmetrical and elliptical-shaped profile. In some embodiments, the recess 542 or 544 protrudes laterally from the recess extension 742 or 744.

In operation 210, stressor material with a lattice constant different from that of the body structure is grown in the extended recesses. The extended recess includes the recess 542 or 544 and the recess extension 742 or 744 shown in FIG. 7. Referring to FIG. 8, in some embodiments, stressor material is grown in the extended recess and beyond the extended recess to form the source and drain regions 842 and 844. In some embodiments, the stressor material is grown using a selective epitaxial deposition process. In some embodiments, the source or drain region 844 has regions 8442 and 8444 that fill the extended recess, and a region 8446 extended beyond the extended recess. In accordance with the profile of the extended recess, the region 8444 extends laterally under the spacer 3344, and the region 8442 is located under the region 8444 and extends the vertical depth of the region 8444. The profile of the extended recess has been described with reference to FIG. 5. The profile of the region 8446 extended beyond the extended recess is similar to the region 1446 described with reference to FIG. 1C except the symmetry in profile resulted from the adjacent gate 352 described with reference to FIG. 5. The stressor material has been described with reference to FIGS. 1A and 1s omitted here.

A proximity of the source or drain region 844 (shown in FIG. 8) to the gate side wall 332B is controlled by the lateral depth DU of the recess 544 (shown in FIG. 5), and a volume of the source or drain region 844 is controlled by the vertical depth $D_{v2}$ of the recess extension 744 (shown in FIG. 7). By separating operations for forming the recess 542 or 544, and the recess extension 742 or 744, the loading effects that occur during, for example, dry etching of the body structure 322 to form the recess extension 742 or 744 does not affect the proximity of the source or drain region 842 or 844 that has been established during, for example, wet etching of the body structure 322 to form the recess 542 or 544. Therefore, the proximity of the source or drain region 842 or 844 is more stable and less susceptible to loading effects. Further, the optimization of the operations for forming the recess 542 or 544 and the recess extension 742 or 744 can be simplified since the operation for forming the recess 542 or 544 can be optimized with respect to a lateral etch rate, and the operation for forming the recess extension 742 or 744 can be optimized with a vertical etch rate.

Figure 9:
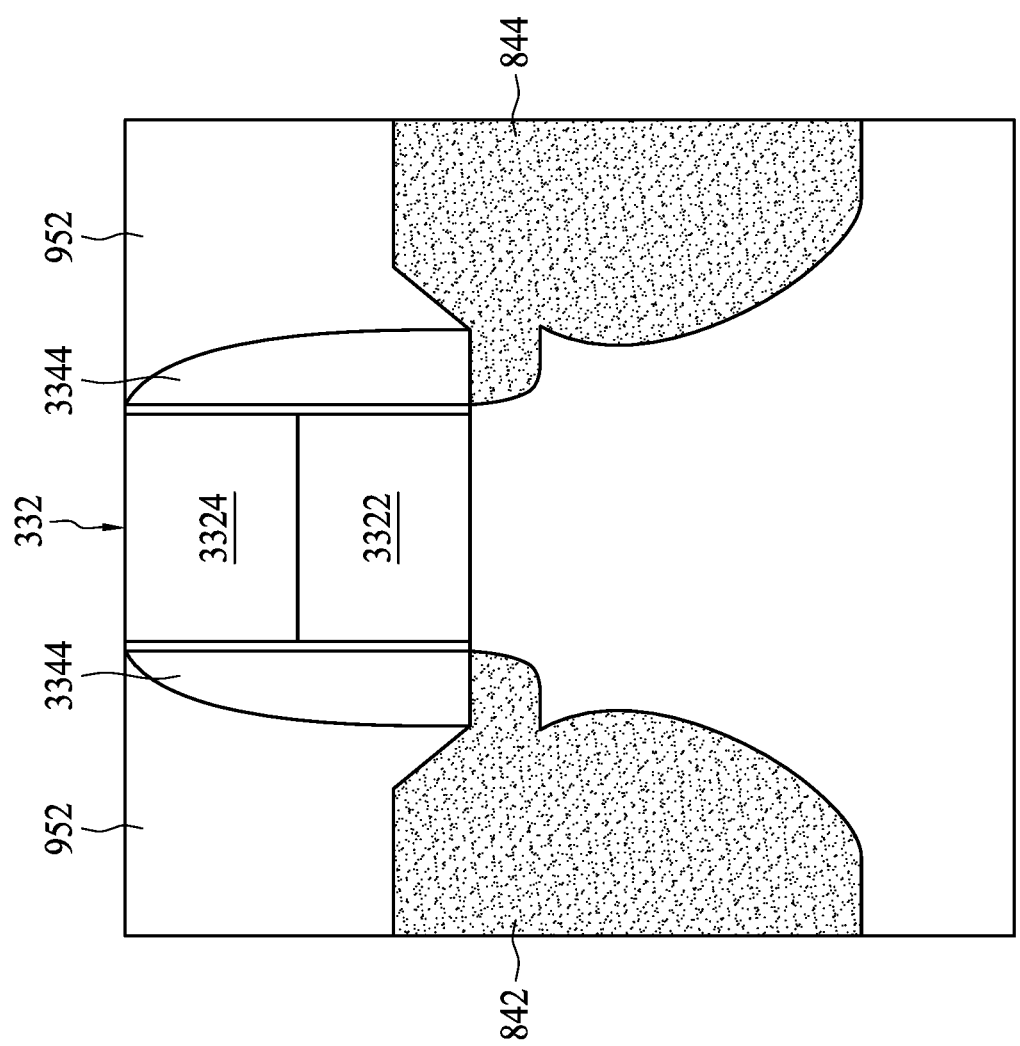
FIGS. 9 to 11 are schematic cross-sectional diagrams illustrating replacement of sacrificial gate materials with gate materials in accordance with some embodiments.
Figure 10:
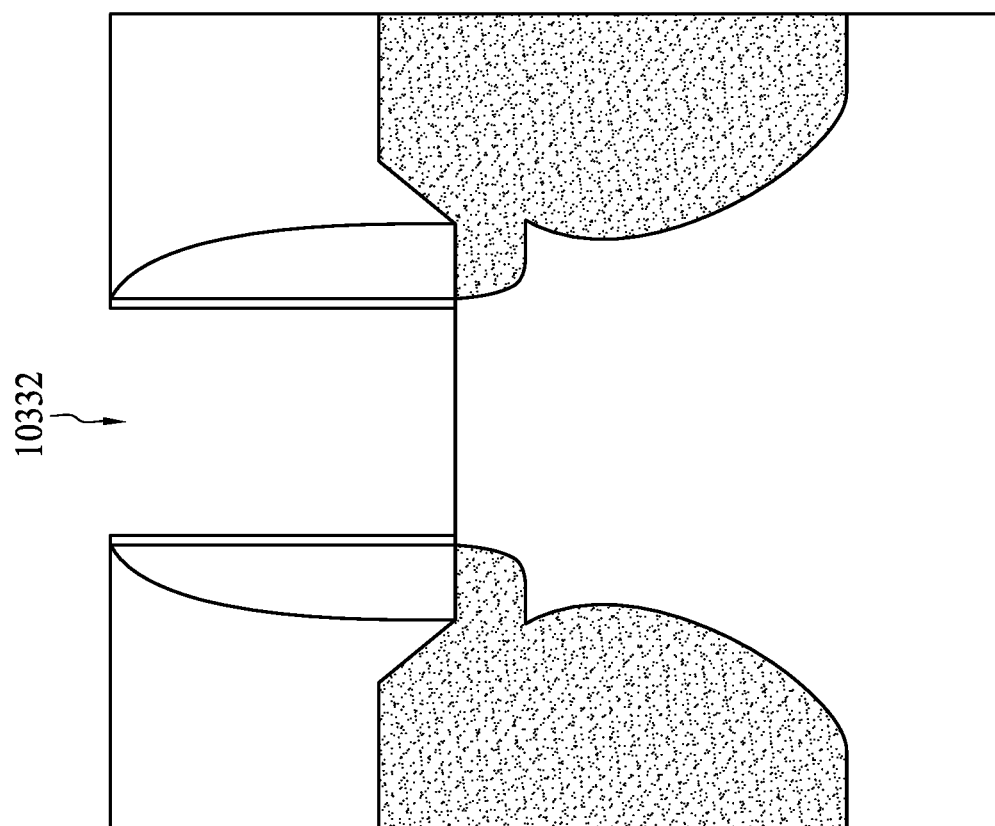
Figure 11:
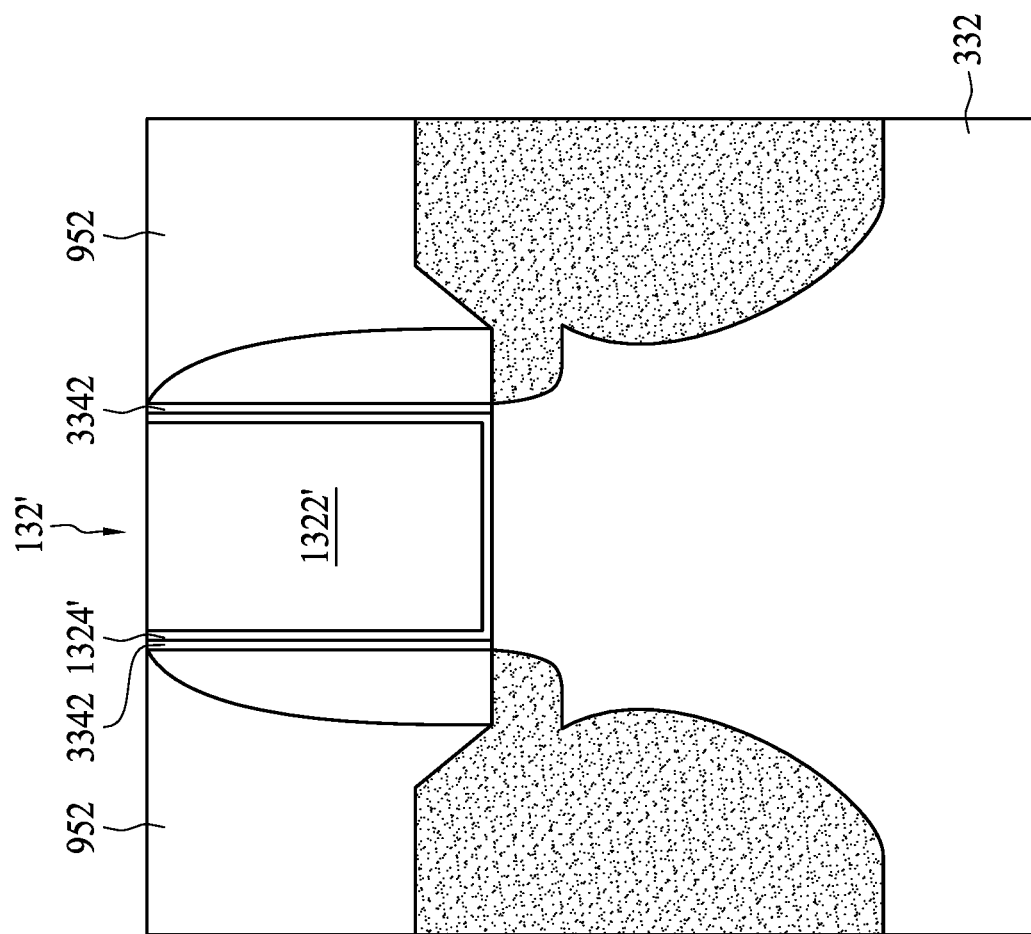

FIGS. 9 to 11 illustrate replacement of sacrificial gate materials with gate materials in accordance with some embodiments. For simplicity, the replacement for the adjacent gate structure 352 is not illustrated. Referring to FIG. 9, in some embodiments, an inter-layer dielectric (ILD) layer 952 surrounding the sacrificial gate structure 332 and abuts the spacers 3344 is formed. In some embodiments, the ILD layer 952 is blanket deposited over the surface 112A of the substrate 112 (labeled in FIG. 3A), and planarized until a top surface of the ILD layer 952 is planar the hard mask 3324. The ILD layer 952 is formed of a material whereby the sacrificial gate structure 332 can be removed without affecting the source or drain regions 842 and 844.

Referring to FIG. 10, in some embodiments, the hard mask 3324 and the sacrificial gate electrode 3322 shown in FIG. 9 are removed in sequence. Then, the patterned sacrificial gate dielectric layer, if exists, is removed. Removal of the hard mask 3324 and the sacrificial gate electrode 3322 exposes the underlying body structure 322 and forms an opening 10332 where the gate structure 132' will be formed.

Referring to FIG. 11, in some embodiments, the gate structure 132' is formed in the opening 10332 (shown in FIG. 10). In some embodiments, one or more gate dielectric layers such as a gate dielectric layer 1324' is conformally deposited on exposed surfaces of the body structure 332, and the sealing layer 3342. In other embodiments, the gate dielectric layer (not shown) is thermally grown on the exposed surfaces of the body structure 332. As described with reference to FIG. 1B, the gate dielectric layer 1324' includes a high-k dielectric material. The gate dielectric layer 1324' can be formed by, for example, CVD or ALD. Then the gate electrode 1322' filling the remaining portion of the opening 10322 is formed. In some embodiments, the gate electrode 1322' includes work function metal layers and fill metal. In some embodiments, the work function metal layers are conformally deposited over the gate dielectric layer 1324' using, for example, CVD or ALD. Then, the fill metal caps over the work function metal layers using, for example, CVD, ALD or sputtering. The fill metal is further planarized until a top surface of the gate electrode 1322' is planar the ILD layer 952. Exemplary materials for forming the work function metal layers and the fill metal have been described with reference to FIG. 1B and are omitted here.

The embodiments described with references to FIGS. 1A to 1C and the embodiments described with references to FIGS. 3A to 11 are with respect to the gate structures 132 and 132' formed with the replacement gate process. However, the present disclosure is not limited to the gate structures 132 and 132' formed using the replacement gate process. In some embodiments, a gate structure having the same profile as the gate structure 132 or 132' is formed by a non-replacement gate process and is formed before the formation of the recesses 542 and 544 shown in FIG. 5. Some embodiments for a non-replacement gate process are described with references to FIGS. 15 to 19.

Figure 12:
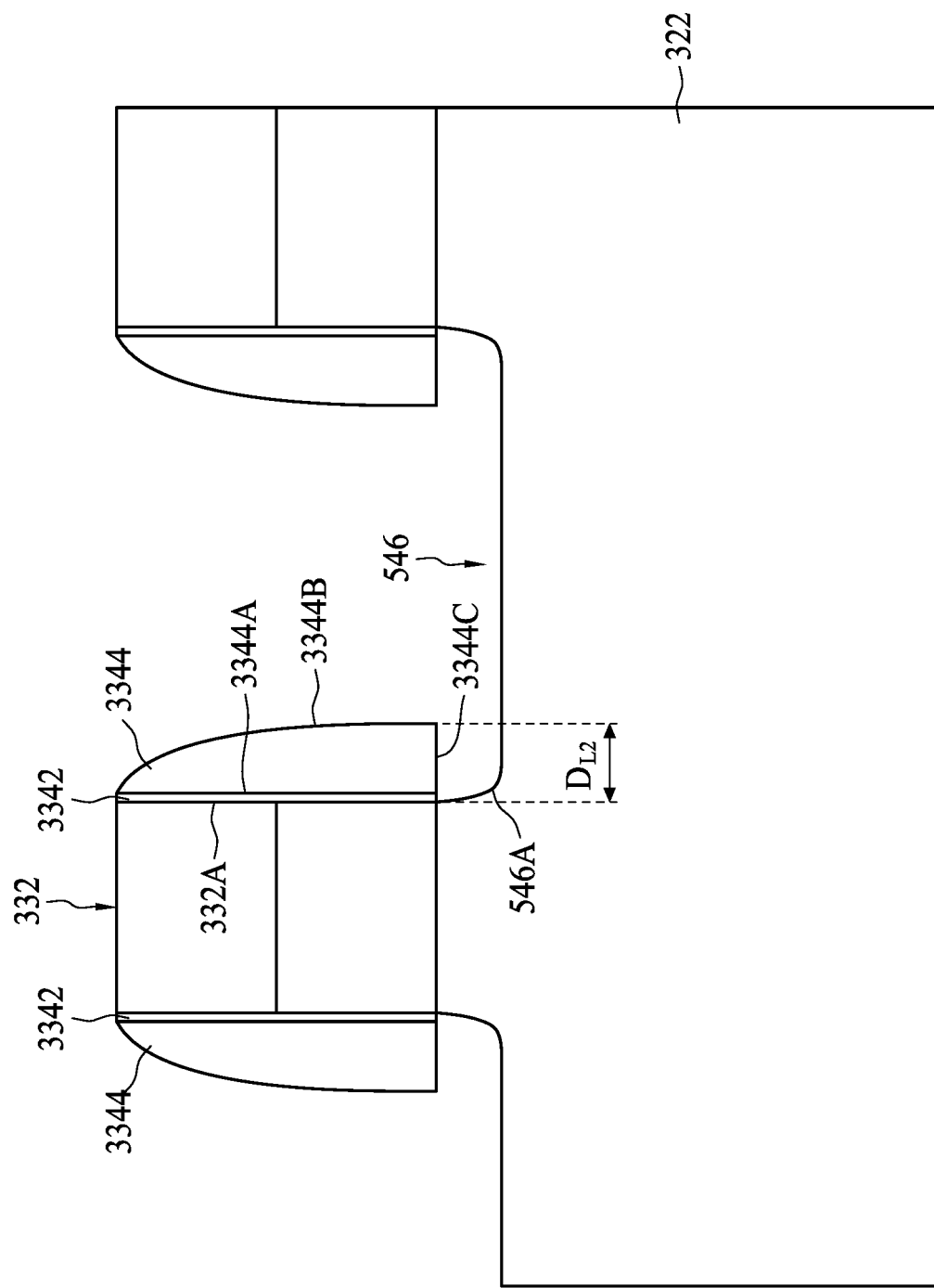
FIG. 12 is a schematic cross-sectional diagram of a semiconductor structure formed by the operation 206 described with reference to FIG. 2 in accordance with other embodiments.

FIG. 12 is a schematic cross-sectional diagram of a semiconductor structure formed by the operation 206 described with reference to FIG. 2 in accordance with other embodiments. The cross-sectional diagram in FIG. 12 is along the gate length $L_{g1}$ (labeled in FIG. 3C) of the sacrificial gate structure 332. Compared to the embodiments described with reference to FIG. 5, the recess 546 has a lateral depth $D_{L2}$ that extends up to the gate side wall 332B instead of the lateral depth $D_{L1}$ that extends up to the side wall 3344A of the spacer 3344. In some embodiments, in addition to the exposed surface 3344C of the spacer 3344 by the recess 546, a surface (not labeled) of the sealing layer 3342 beside the surface 3344C of the spacer 3344 is also exposed. Further, the recess 546 has a wall section 546A tapering toward a plane in the body structure 322 substantially aligned with the gate side wall 332B from a portion of the wall section 546A corresponding to the side wall 3344B of the spacer 3344 to a portion of the wall section 546A corresponding to the gate side wall 332B. In some embodiments, the wall section 546A under the surface 3344C of the spacer 3344 and the surface of the sealing layer 3342 exposed by the recess 546 tapers toward a plane in the body structure 322 substantially aligned with the gate side wall 332B along a direction of exposure of the surface 3344C of the spacer 3344 and the surface of the sealing layer 3342.

Figure 13:
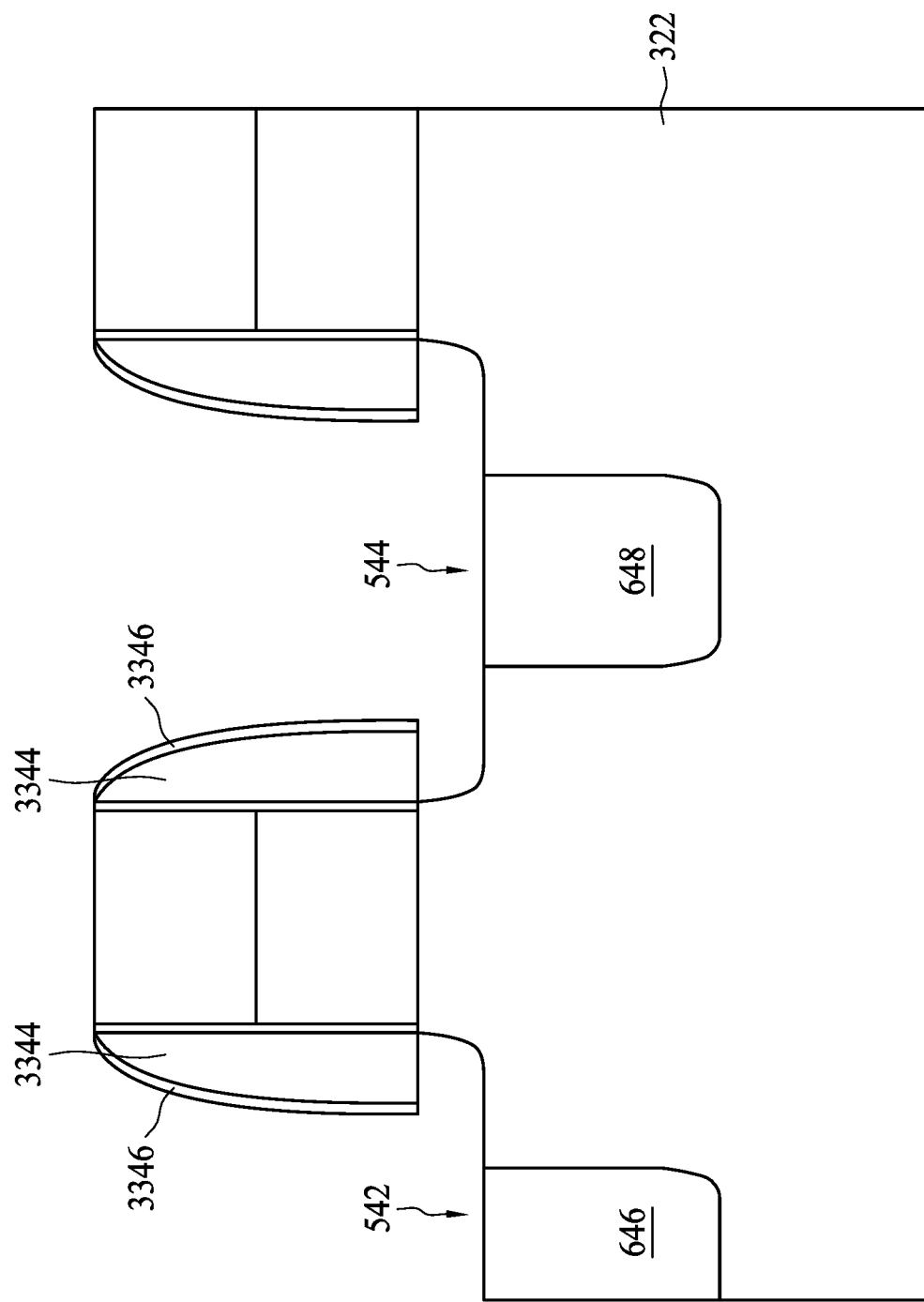
FIG. 13 is a schematic cross-sectional diagram of a semiconductor structure during the operation 208 described with reference to FIG. 2 in accordance with other embodiments.

FIG. 13 is a schematic cross-sectional diagram of a semiconductor structure during the operation 208 described with reference to FIG. 2 in accordance with other embodiments. The cross-sectional diagram in FIG. 13 is along the gate length $L_{g1}$ (labeled in FIG. 3C) of the sacrificial gate structure 332. Compared to the embodiments described with reference to FIG. 6, dummy spacers 3346 are further formed on the spacer 3344 before forming doping regions 646 and 648. In some embodiments, a refractory metal silicide layer is formed over the source and drain regions 842 and 844 (shown in FIG. 8). A semiconductor film layer such as a silicon film layer may be formed between the source and drain regions 842 and 844 and the silicide layer to, for example, provide enough silicon material to be used or consumed during the formation of a silicide layer. By forming the dummy spacers 3346, the gate structure 132' shown in FIG. 11 is shielded from possible silicide encroachment during forming the silicide layer to minimize the possibility of shortening of the gate structure 132'. In some embodiments, the dummy spacer 3346 includes $Si_3N_4$, SiOCN, SiON, SiCN, or $SiO_2$. In some embodiments, the dummy spacer 3346 is formed by any of the methods such as PVD, PECVD, CVD, ALD, or other methods deemed appropriate by those skilled in the art. In the embodiments illustratively shown in FIG. 13, the doping regions 646 and 648. Therefore the doping regions 642 and 646 are formed beside the dummy spacers 3346.

Figure 14:
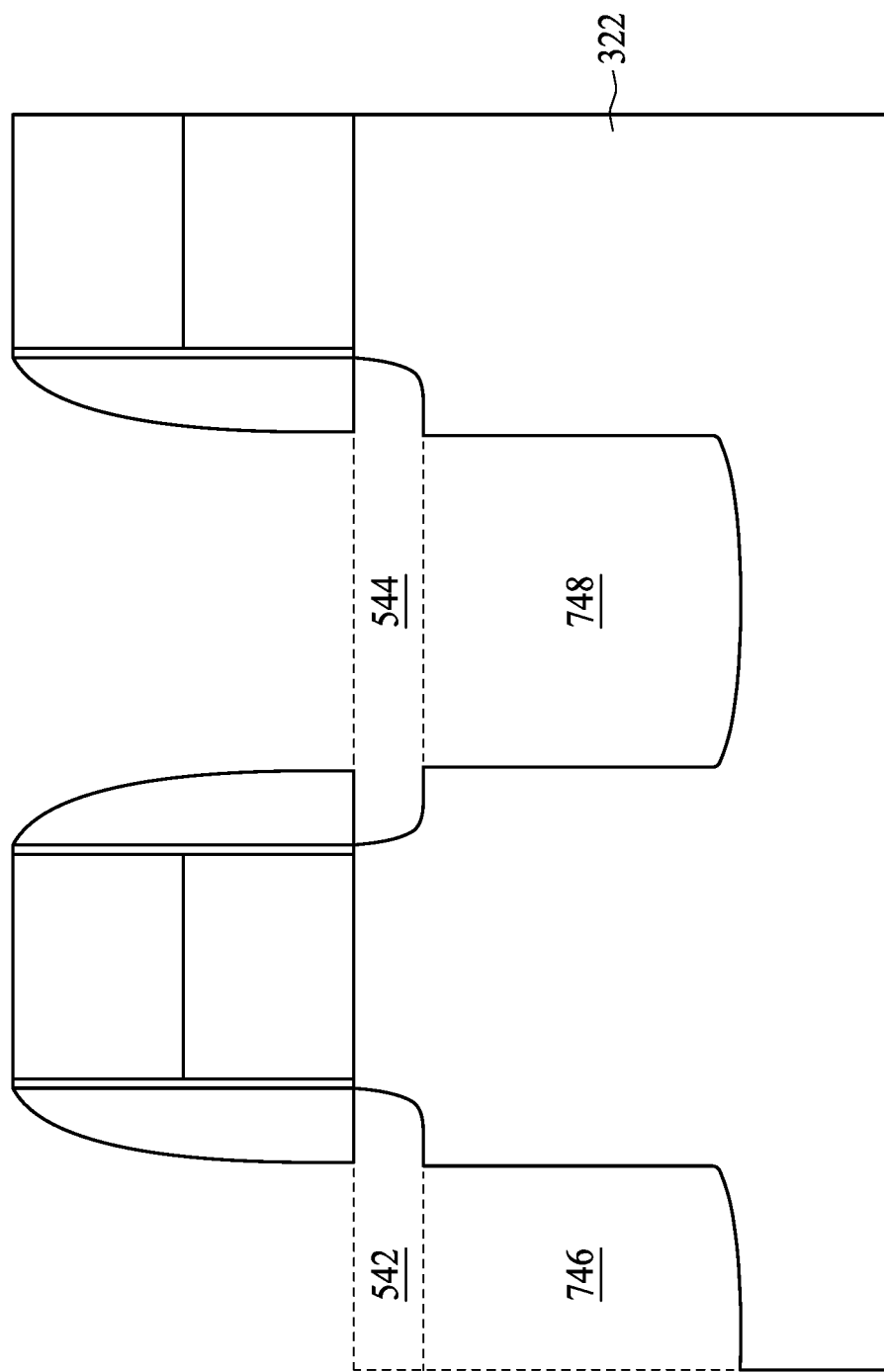
FIG. 14 is a schematic cross-sectional diagram of a semiconductor structure formed by the operation 208 described with reference to FIG. 2 in accordance with other embodiments.

FIG. 14 is a schematic cross-sectional diagram of a semiconductor structure formed by the operation 208 described with reference to FIG. 2 in accordance with other embodiments. The cross-sectional diagram in FIG. 14 is a long the gate length $L_{g1}$ (labeled in FIG. 3C) of the sacrificial gate structure 332. Compared to the embodiments described with references to FIGS. 6 and 7 which form doping regions 642 and 644 to enhance the etch rate of, for example, dry chemical etching to form the recess extensions 742 and 744, recess extensions 746 and 748 in FIG. 14 are formed using reactive ion etching which involves inducing chemical reaction at a surface to be etched by impinging ions, electrons, or photons. The recess extensions 746 and 748 formed by reactive ion etching has a rectangular-shaped profile which is more anisotropic than the recess extensions 742 and 744 formed by doping and dry chemical etching.

Figure 15:
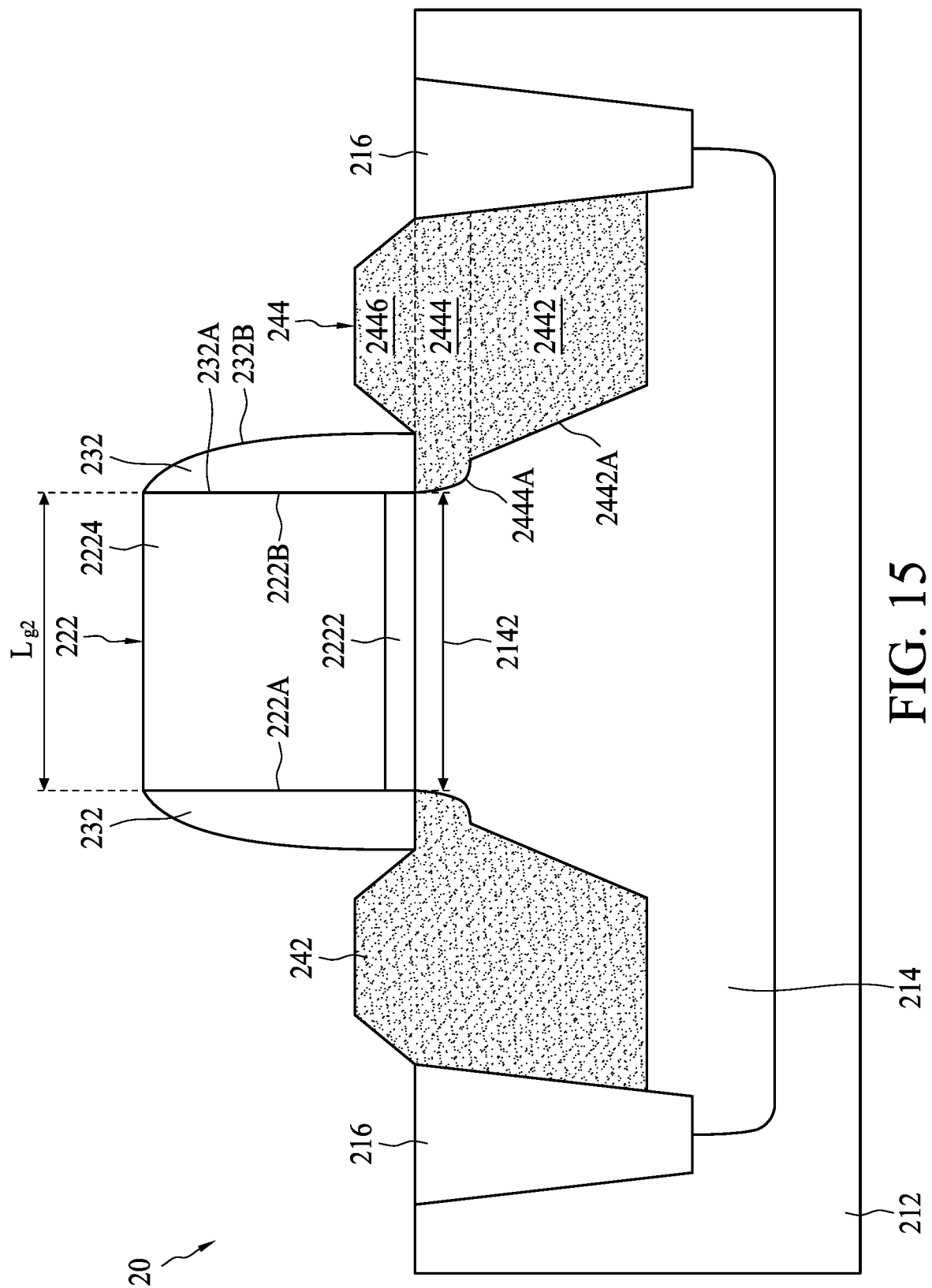
FIG. 15 is a schematic cross-sectional diagram of a MOSFET structure having source and drain regions containing epitaxially grown stressor material in accordance with some embodiments.

FIG. 15 is a schematic cross-sectional diagram of a MOSFET structure 20 having source and drain regions 242 and 244 containing epitaxially grown stressor material in accordance with some embodiments. The MOSFET structure 20 includes a body structure 214, dielectric isolation regions 216, a gate structure 222 with spacers 232, and source and drain regions 242 and 244.

In some embodiments, the MOSFET structure 20 includes a p-type FET. The body structure 214 is an N-well region in a p-type substrate 212. In some embodiments, the substrate 212 is a bulk semiconductor substrate in a crystalline structure, such as a bulk silicon substrate. The substrate 212 is doped with p-type dopants to form the p-type substrate. A region in the substrate 212 is further doped with n-type dopants such as phosphorous (P) and arsenic (As) to form the N-well region. In other embodiments, the body structure (not shown) is an n-type substrate. In some embodiments, the MOSFET structure (not shown) includes an n-type FET. The body structure is the p-type substrate 212.

In some embodiments, the gate structure 222 is formed on the body structure 214. The gate structure 222 includes a gate dielectric layer 2222 formed on the body structure 214 and a gate electrode 2224 formed on the gate dielectric layer 2222. In some embodiments, the gate dielectric layer 2222 includes a high-k dielectric material as described with reference to FIG. 1A. In some embodiments, the gate electrode 2224 includes one or more layers such as work function metal layers and a metal layer similar to the work function metal layers and the fill metal in the gate electrode 1324 described with reference to FIG. 1A, respectively.

In some embodiments, the dielectric isolations regions 216 are formed at two ends of a boundary of the body structure 214 to isolate the MOSFET structure 20. In some embodiments, the dielectric isolation regions 216 includes similar material as the dielectric isolation region 114 described with reference to FIG. 1B.

In some embodiments, the source and drain regions 242 and 244 containing epitaxially grown stressor material are configured on opposite sides of the gate structure 222 and abut the dielectric isolation regions 216. In some embodiments, the gate structure 222 has opposite side walls 222A and 222B across a gate length $L_{g2}$ of the gate structure 132. Spacers 232 are formed on the side walls 222A and 222B of the gate structure 222. The source and drain regions 242 and 244 are configured beside the spacers 232 and have regions that are embedded in the body structure 214, such as a region 2442 and a region 2444, and a region beyond the body structure 214, such as a region 2446. The regions 2442, 2444 and 2446 in FIG. 15 are similar to the regions 1442, 1444 and 1446 described with reference to FIG. 1C. One of the differences between the region 1446 and the region 2446 is that the region 1446 has an elliptical-shaped profile while the region 2446 has a diamond-shaped profile. A wall section of the diamond-shaped profile forming a vertex with a wall section 2442A of the diamond-shaped profile is replaced by a wall section 2444A of the region 2444. The wall section 2444A is under the spacer 232 and tapers towards a plane in the body structure 214 substantially aligned with the gate side wall 222B from a bottom of the wall section 2444A to a top of the wall section 2444A. The bottom of the wall section 2444A is substantially aligned or more closely aligned with a side wall 232B of the spacer 232, and the top of the wall section 2444A is substantially aligned or more closely aligned with a side wall 232A of the spacer 232. Therefore, the wall section 2444A has a closer proximity to the channel region 2142 than the replaced wall section forming the vertex with the wall section 2442A of the diamond-shaped profile. The stressor material forming the source and drain regions 242 and 244 are similar to that forming the source and drain regions 142 and 144 described with reference to FIG. 1C and are omitted here.

Figure 16:
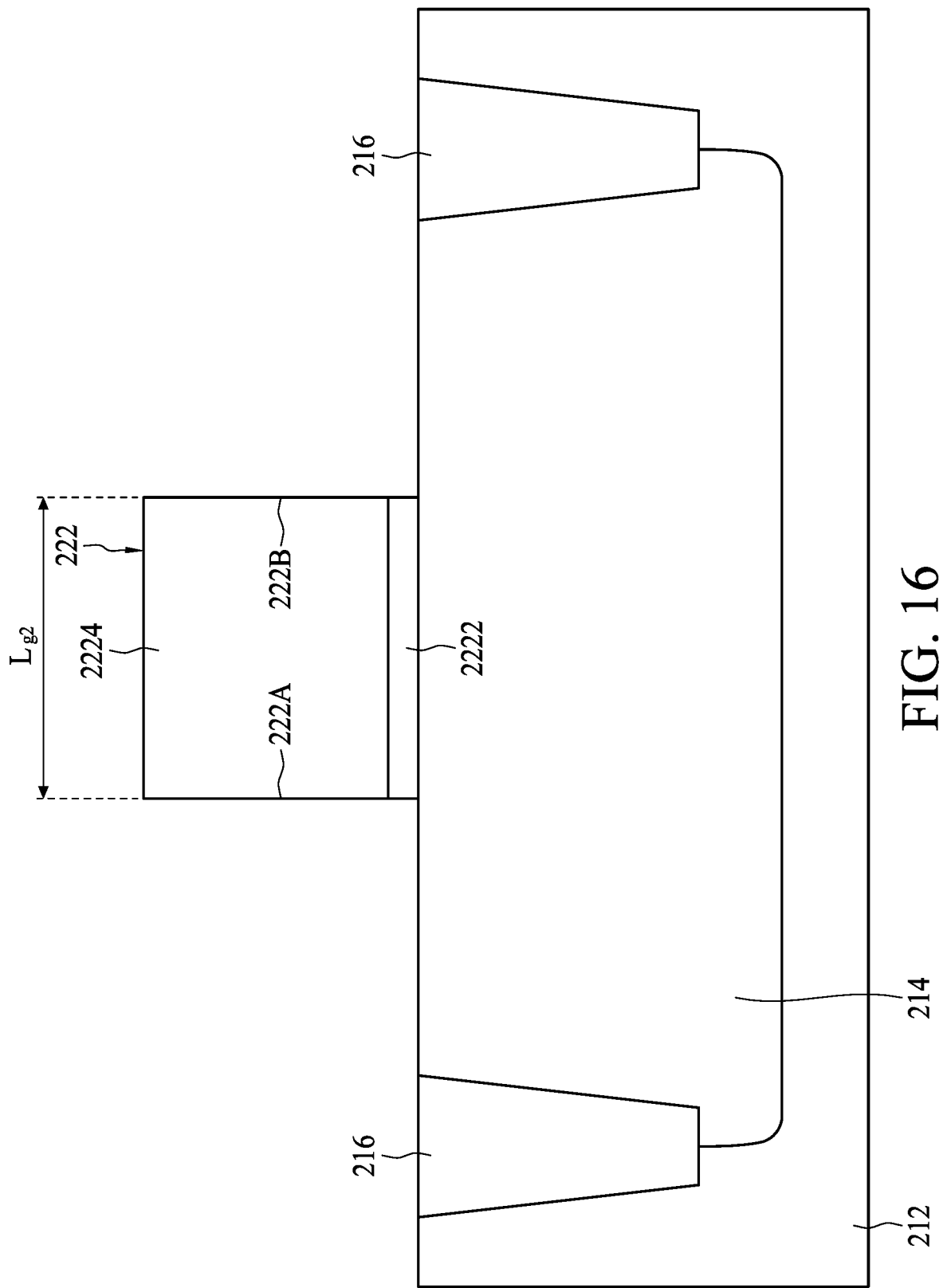
FIGS. 16 to 19 are schematic cross-sectional diagrams illustrating semiconductor structures after each operation of a method for forming the MOSFET structure in FIG. 15 in accordance with some embodiments.

FIGS. 16 to 19 and FIG. 15 are schematic cross-sectional diagrams illustrating semiconductor structures after each operation of a method for forming the MOSFET structure 20 in FIG. 15 in accordance with some embodiments. The method illustrated in FIGS. 16 to 19 and FIG. 15 provide further details to the method described with reference to FIG. 2. In operation 202, a body structure with a gate structure configured thereon is provided. Referring to FIG. 16, in some embodiments, the body structure 214 is a well region in the substrate 212. The substrate 212 is doped with one conductivity type such as p type while the body structure 214 is doped with an opposite conductivity type such as n type. Trenches are formed at two ends of a boundary of the body structure 214, and are filled with one or more dielectric materials to form the dielectric isolation regions 216. Compared to the gate structure 132' (shown in FIG. 11) which is formed by a replacement gate process, the gate structure 222 is formed by a non-replacement gate process. A gate dielectric layer is blanket deposited on the substrate 212 and one or more metal layers are deposited on the gate dielectric layer. In some embodiments, the gate dielectric layer and one or more metal layers are deposited using CVD, ALD, or other deposition methods deemed appropriate by those skilled in the art. The materials of the gate dielectric layer and the one or more metal layers are similar to those described with reference to FIG. 1B and are omitted here. In order to pattern the gate dielectric layer and the one or more metal layers into the gate dielectric layer 2222 and the gate electrode 2224, a photoresist layer is deposited over the one or more metal layers and patterned into a photoresist mask that defines the desired area of the gate structure 222. The pattern of the photoresist mask is then transferred to the underlying one or more metal layers and the gate dielectric layer. In some embodiments, a hard mask is formed on the one or more metal layers to facilitate transferring of the pattern defined by the photoresist layer and to protect the gate electrode 222 from being affected by subsequent processing operations. In some embodiments, the transferring of the pattern from the photoresist mask to the underlying layers is performed by anisotropic etching. The formed gate structure 222 has vertical gate side walls 222A and 222B across the gate length $L_{g2}$.

Figure 17:
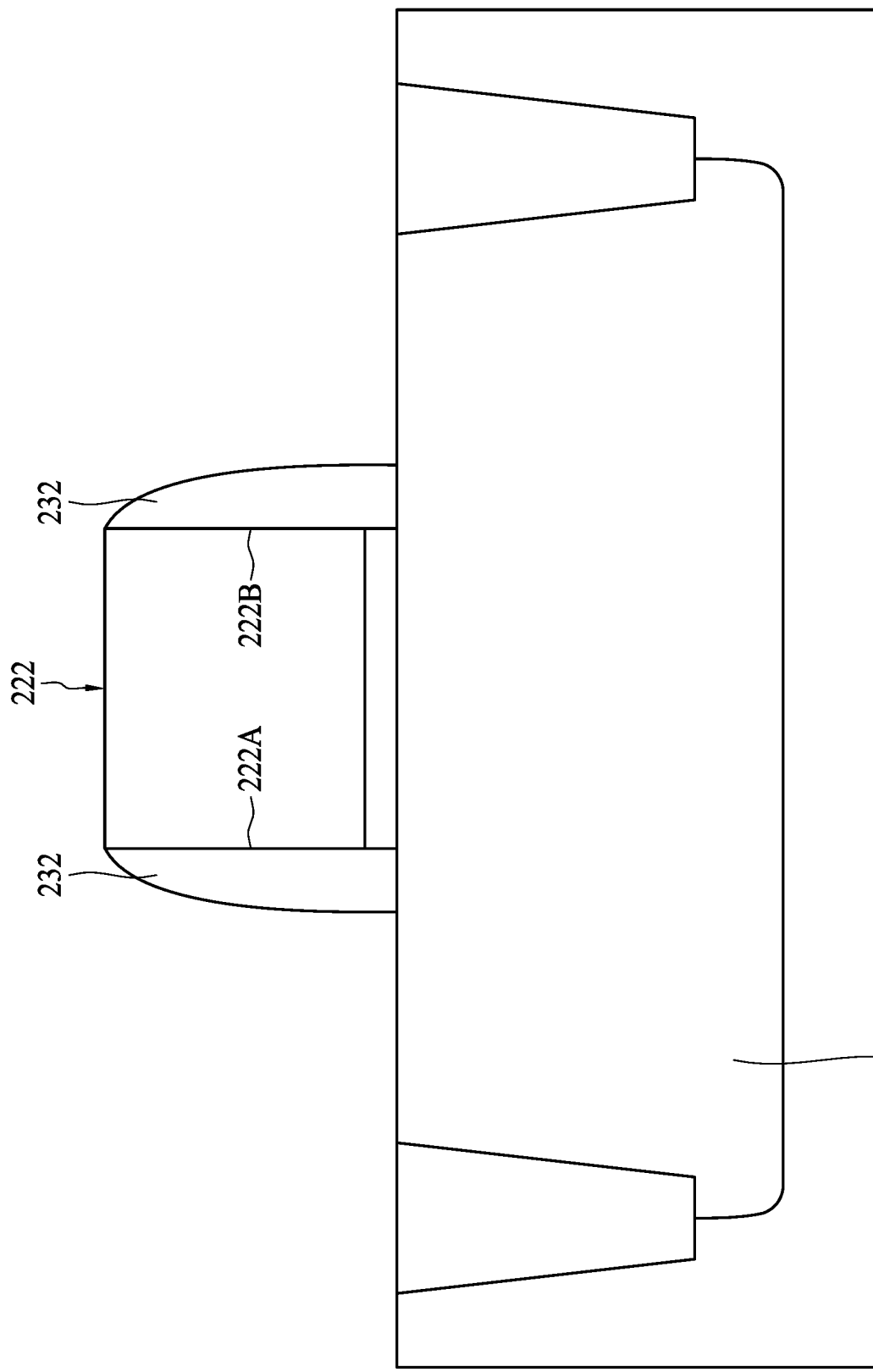

In operation 204, a spacer is formed over a gate side wall of a gate structure. Referring to FIG. 17, in some embodiments, the spacer 232 is formed on the gate side walls 222A and 222B of the gate structure 222. Each spacer 232 can include one or more layers. In some embodiments, material and a method for forming the spacers 232 are similar to those of the spacers 3344 described with reference to FIG. 4.

Figure 18:
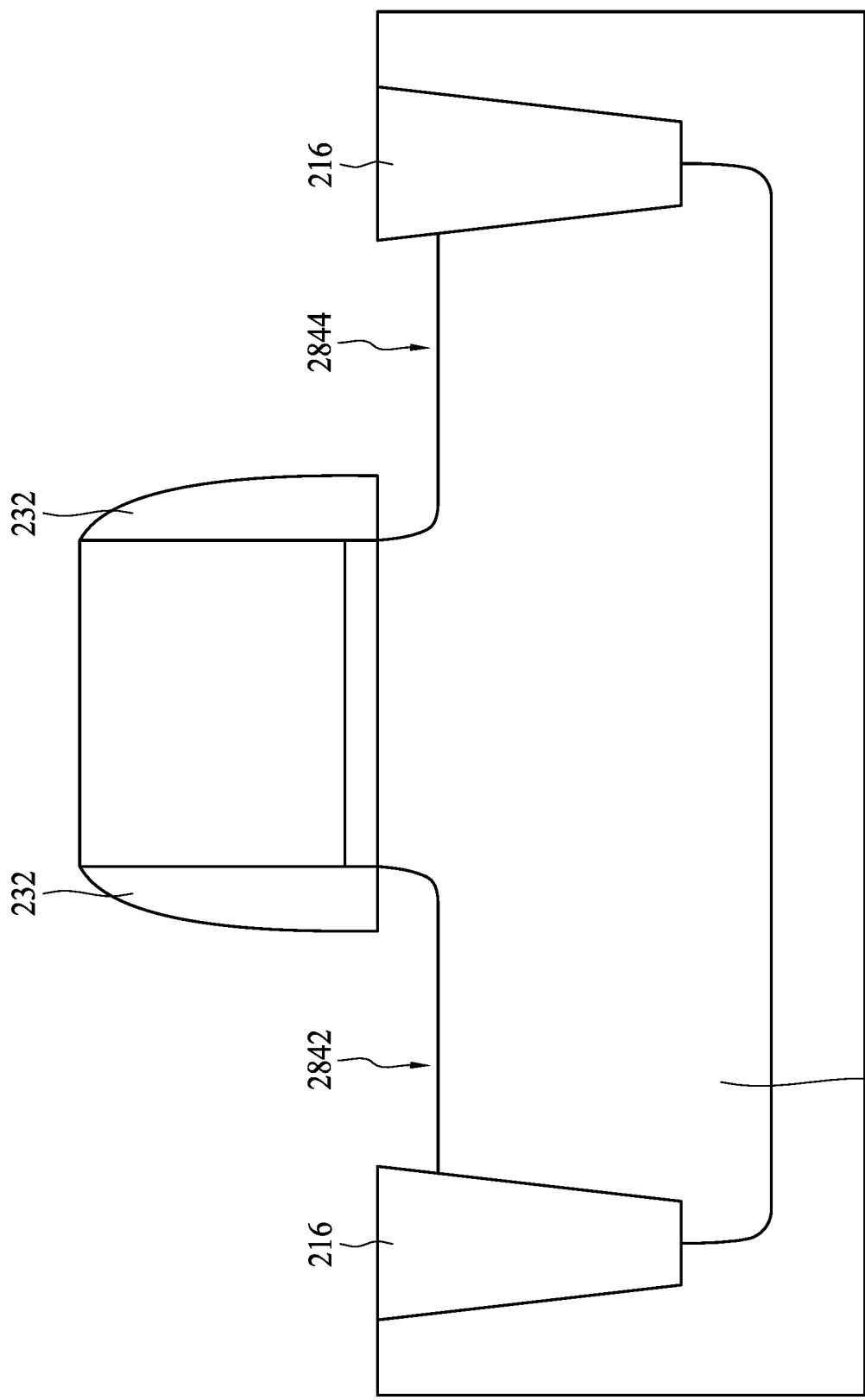

In operation 206, a recess beside the spacer and extended laterally under the spacer is formed in the body structure. Referring to FIG. 18, in some embodiments, recesses 2842 and 2844 are formed in the body structure 214 between the spacers 232 and the dielectric isolation regions 216. The recesses 2842 and 2844 extend laterally under the spacers 232. The recesses 2842 and 2844 are formed similarly as the recesses 542 and 544 described with reference to FIG. 5.

Figure 19:
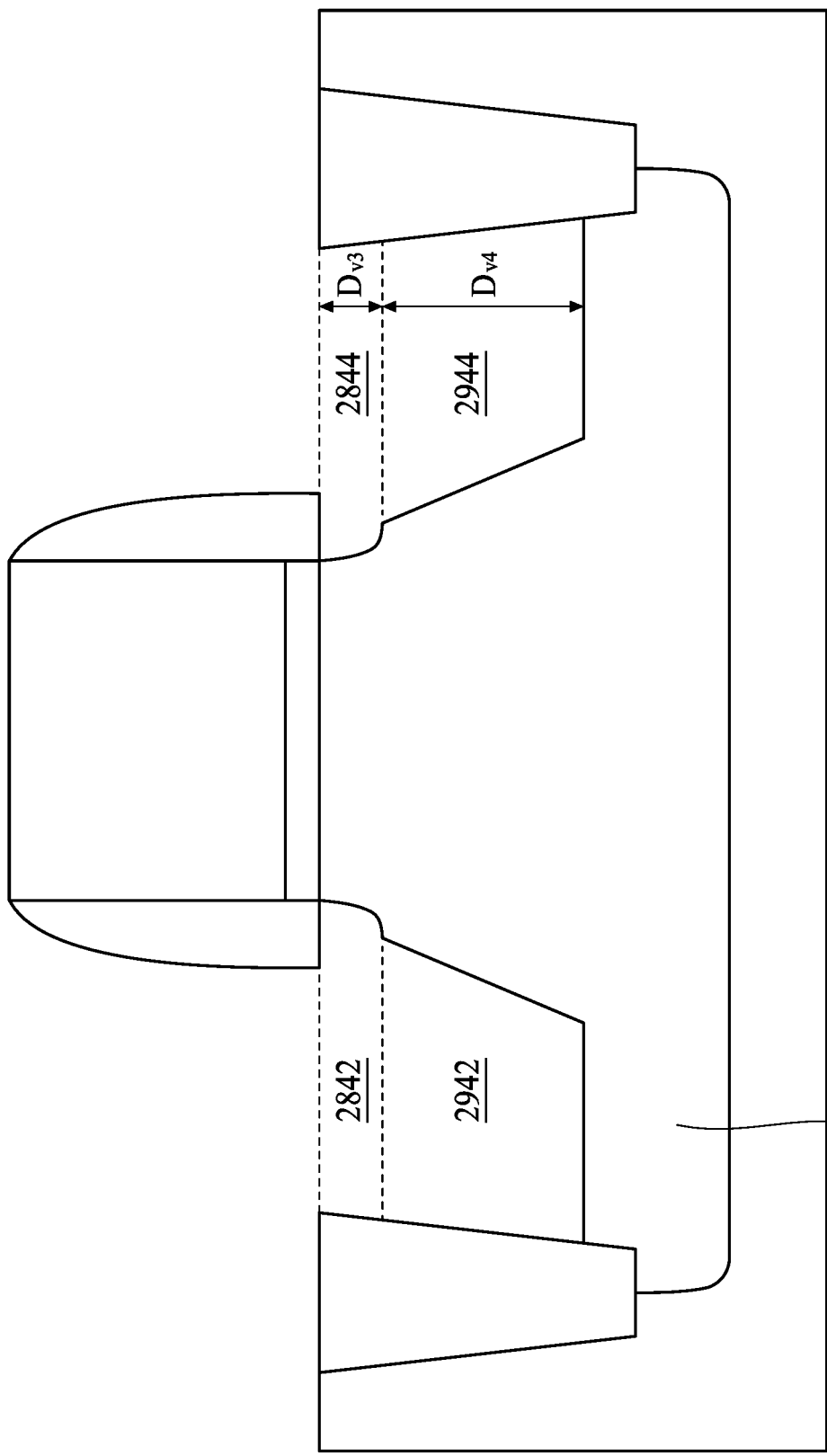

In operation 208, a recess extension is formed under the recess to extend a vertical depth of the recess. Referring to FIG. 19, in some embodiments, a vertical depth $D_{v3}$ of the recess 2844 is extended by a recess extension 2944 with a vertical depth $D_{v4}$ so that an extended recess has a total vertical depth of $D_{v3}+D_{v4}$. In some embodiments, the recess extension 2944 is formed by a dry etch first to reach the vertical depth $D_{v4}$ with respect to the recess 2844, and then by an anisotropic wet etch to form the diamond-shaped profile. Anisotropic wet etching is also known as orientation-dependent wet etching which has different etch rate along different crystal directions. In some embodiments, the recess extensions 2942 and 2944 are formed such that the recesses 2842 and 2844 protrude laterally from the recess extensions 2942 and 2944. Although the recess extensions 744 and 748 for the FinFET structure described with references to FIGS. 7 and 14 have the elliptical-shaped profile and the rectangular-shaped profile, and the recess extension 2944 for the MOSFET structure described with reference to FIG. 19 has the diamond-shaped profile, the elliptical-shaped and rectangular-shaped profiles are applicable to the MOSFET structure, and the diamond-shaped profile is applicable to the FinFET structure.

In operation 210, stressor material with a lattice constant different from that of the body structure is grown in the extended recess. The extended recess includes the recess 2842 or 2844 and the recess extension 2942 or 2944 shown in FIG. 19. Referring to FIG. 15, in some embodiments, stressor material is grown in the extended recess and beyond the extended recess to form the source and drain regions 242 and 244. The method for growing the stressor material and the stressor material are similar to those described with reference to FIG. 8 and FIG. 1C, and are omitted here.

Similar to the method described with references to FIGS. 3A to 11, a proximity of the source or drain region 242 or 244 (shown in FIG. 15) to the gate side wall 222A or 222B and a volume of the source or drain region 242 or 244 are controlled separately by the operation for forming the recess 2842 or 2844 (shown in FIG. 18) and the operation for forming the recess extension 2942 or 2944 (shown in FIG. 19). Therefore, the proximity of the source or drain region 242 or 244 to the channel region 2142 (shown in FIG. 15) is stable. Further, optimization of the operations for forming the recess 2842 or 2844 and the recess extension 2942 or 2944 cab be directed to a lateral etch rate, and a vertical etch rate, respectively.

Embedded Source or Drain Region with Downward Tapered Region Under Facet Region

Figure 20:
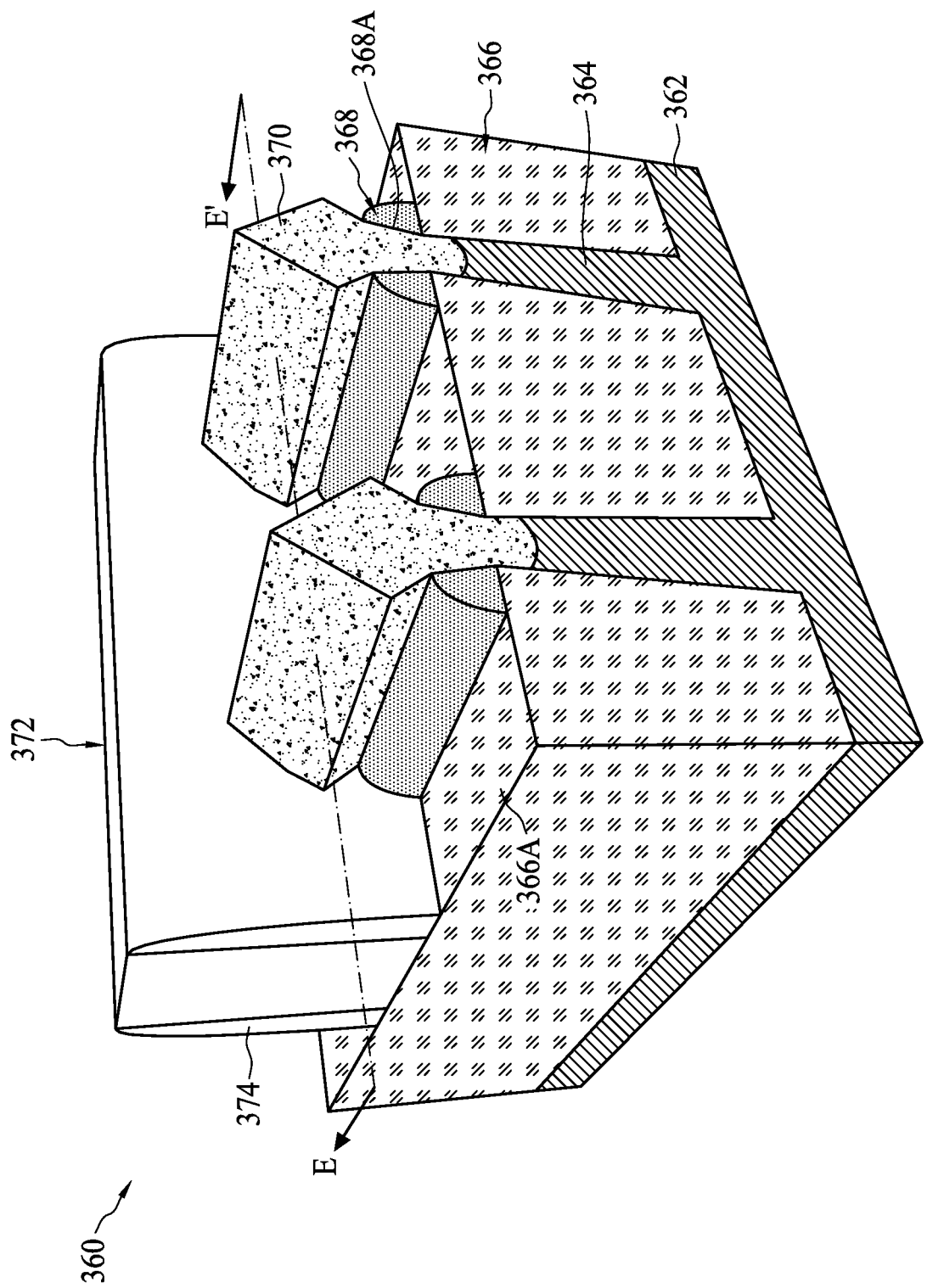
FIG. 20 is a schematic perspective diagram of a FinFET structure having a source or drain region containing epitaxially grown stressor material in accordance with some embodiments.

FIG. 20 is a schematic perspective diagram of a FinFET structure 360 having a source or drain region 370 containing epitaxially grown stressor material in accordance with some embodiments. In FIG. 20, fin spacers 368 have downward tapered sidewalls 368A that define a source or drain recess 369 (shown in FIG. 21) in which the source or drain region 370 is to be grown. The FinFET structure 36 includes a substrate 362, a body structure 364, dielectric isolation regions 366, a gate structure 372, gate spacers 374, fin spacers 368 and the source or drain region 370. The substrate 362, the body structure 364, the dielectric isolation regions 366, the gate structure 372 and the gate spacers 374 are similar to the substrate 112, the body structure 122, the dielectric isolation regions 114, the gate structure 132, the spacers 1344 described with references to FIGS. 1A, 1B and 1C, respectively, and are omitted here.

Referring to FIG. 20, top surfaces of the dielectric isolation regions 366 form a first surface 366A. The top surfaces of the dielectric isolation regions 366 are similar to the top surfaces 114A of the dielectric isolation regions 114 described with references to FIGS. 1A and 1B. The first surface 366A is substantially aligned with a bottom of the gate structure 372.

Figure 21:
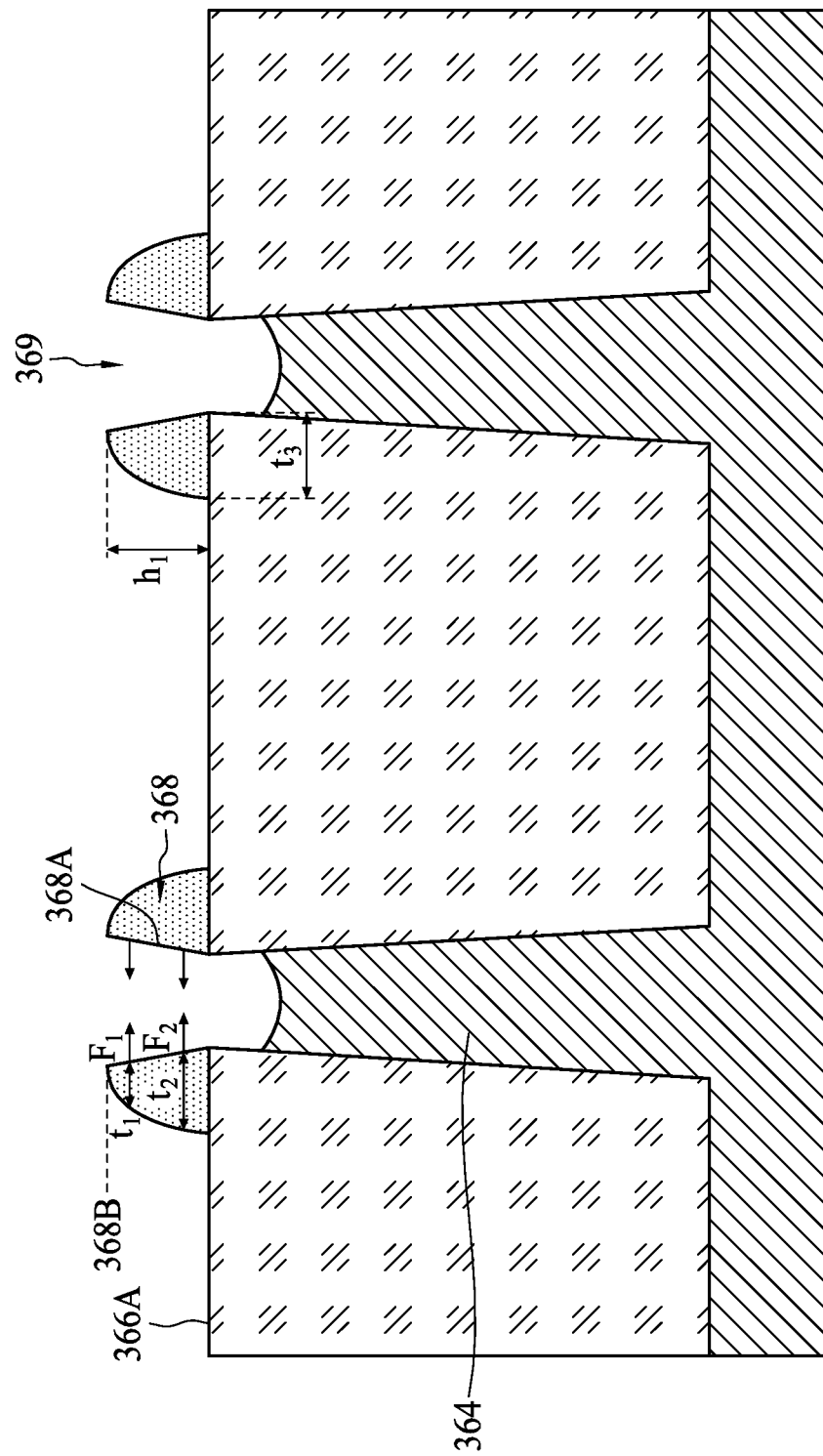
FIG. 21 is a schematic cross-sectional diagram along line E-E' in FIG. 20 for illustrating the fin spacers in accordance with some embodiments.

The fin spacers 368 are formed over the first surface 366A and abuts portions of sidewalls of the body structure 364 before a source or drain recess 369 (shown in FIG. 21) is formed in the body structure 364. For example, in FIG. 25B, the fin spacers 368 abuts the portions of the sidewalls of the body structure 364 extended beyond the first surface 366A before the source or drain recess 369, as shown in FIG. 25C, is formed in the body structure 364. FIG. 21 is a schematic cross-sectional diagram along line E-E' in FIG. 20 for illustrating the fin spacers 368 in accordance with some embodiments. In FIG. 21, the source or drain recess 369 is formed in the body structure 364. Each of the fin spacers 368 has gradually increased thickness along a direction from a top 368B of the fin spacers 368 to the first surface 366A. For example, the fin spacer 368 has a larger thickness $t_2$ at a level closer to the first surface 366A than a thickness $t_1$ at a level farther away from the first surface 366A. Before the source or drain recess 369 is formed, due to the differences in thickness of the fin spacers 368, different stresses are applied to the body structure 364 (shown in FIG. 25B) in between the fin spacers 368. For example, a stress $F_2$ corresponding to the larger thickness $t_2$ is larger than a stress $F_1$ corresponding to the smaller thickness $t_2$. When the source or drain region recess 369 is formed, the portions of the body structure 364 against side walls 368A of the fin spacers 368 are removed. Therefore, the sidewalls 368A are downward tapered due to the differences in stresses such as $F_1$ and $F_2$ exerted at different levels of the fin spacers 368 between the first surface 366A and the top 368B of the fin spacers 368. In some embodiments, a thickness $t_3$ of each of the fin spacers 368 at the level of the first surface 366A has a range of about 0.1 nm to about 200 nm. A height $h_1$ of each of the fin spacers 368 has a range of about 0.1 nm to about 200 nm. The term "about" used herein means greater or less than the stated value or the stated range of values by ⅒ of the stated values. In some embodiments, exemplary materials for forming the fin spacers 368 include $Si_3N_4$, SiON, SiOCN, SiCN, and $SiO_2$.

Referring to FIG. 20, the source or drain region 370 is formed by epitaxially growing stressor material in the source or drain recess 369 shown in FIG. 21. Therefore, the source or drain region 370 is embedded in the body structure 364 beside the gate structure 372. Furthermore, the epitaxially grown source or drain region 370 extends beyond the fin spacers 368. Exemplary stressor materials have been provided with reference to FIG. 1A. Further, for a p-type FinFET 360, the source or drain region 370 is doped with p-type dopants such as boron. For an n-type FinFET 360, the source or drain region 370 is doped with n-type dopants such as phosphorous or arsenic.

Figure 22:
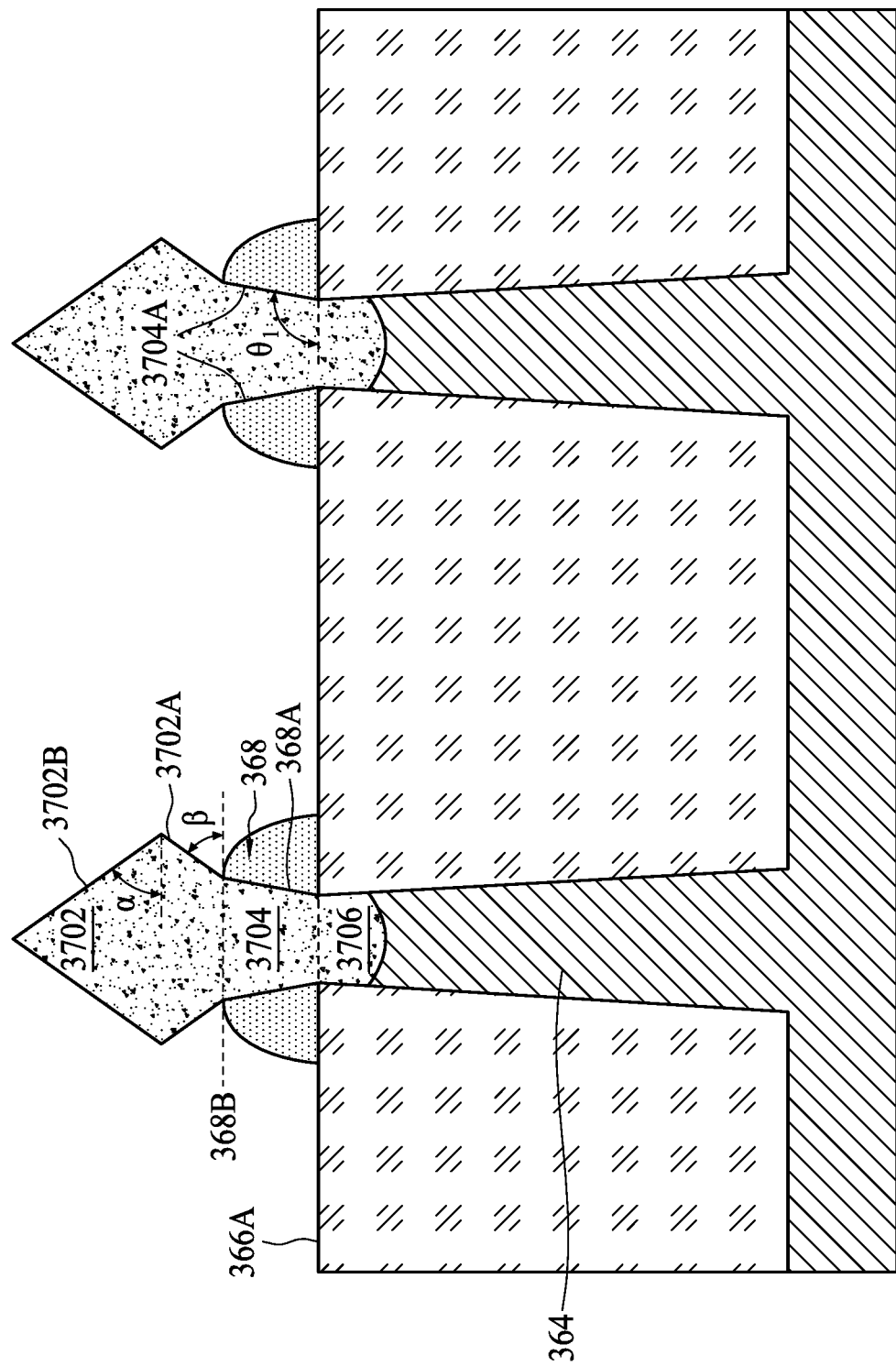
FIG. 22 is a schematic cross-sectional diagram along line E-E' in FIG. 20 for illustrating the epitaxially grown source or drain region with a downward tapered region under a facet region in accordance with some embodiments.

FIG. 22 is a schematic cross-sectional diagram along line E-E' in FIG. 20 for illustrating the epitaxially grown source or drain region 370 with a downward tapered region 3704 under a facet region 3702 in accordance with some embodiments. The source or drain region 370 includes the facet region 3702, the downward tapered region 3704 and may further include a less tapered region 3706. During epitaxial growth of the source or drain region 370, due to different growth rates on different surface planes, facets can be formed. For example, the growth rate on surfaces having (111) surface orientations (referred to as (111) planes) is lower than on other planes such as (110) and (100) planes. Therefore, facets 3702A and 3702B, etc. are formed as a result of difference in growth rates of the different planes. Beyond the top 368B of the fin spacers 368, if the source or drain region 370 is grown freely, eventually facets 3702A and 3702B, etc. will have the (111) surface orientations. The shape of the facet region 3702 is similar to a rhombus shape. The facet 3702B has an internal angle α of 54.7° with respect to a plane substantially parallel to the first surface 366A. The facet 3702A has an external angle β of 54.7° with respect to the plane substantially parallel to the first surface 366A.

Under the facet region 3702, the downward tapered region 3704 that abuts the downward tapered side walls 368A is formed. The downward tapered region 3704 exists between the top 368B of the fin spacers 368 and the first surface 366A. As described with reference to FIG. 21, due to the gradually increased thicknesses along the direction from the top 368B of the fin spacer 368 to the first surface 366A, the side walls 368A of the fin spacers 368 are downward tapered. Therefore, the region 3704 grown in between the downward tapered side walls 368 of the fin spacers 368B also have downward tapered side walls 3704A. In some embodiments, each of the side walls 3704A has an internal angle $\theta_1$ with respect to a plane substantially parallel to the first surface 366A. The internal angle $\theta_1$ is above 20 and below 160 degree. Because of the downward tapered side walls 368A, the fin spacers 368 open more widely at the level of the top 368B of the fin spacers 368 to receive the stressor material, and therefore expands a base where the facet region 3702 grows from. As a result, a volume of the source or drain region 370 is increased. The larger the volume of the source or drain region 370 that contains the stressor material is, the higher the magnitude of the mechanical stress applied to a channel region from the source or drain region 370 is, and therefore, the more enhanced the carrier mobility in the channel region is.

In some embodiments, the region 3706 between the downward tapered region 3704 and the remaining body structure 364 has less tapered side walls compared to the region 3704. In some embodiments, the regions 3702, 3704 and 3706 divide the source or drain region 370 along a direction substantially parallel to a width $W_{g1}$ (shown in FIG. 1B) of the gate structure 372. In some embodiments, along a direction substantially parallel to a length $L_{g1}$ (shown in FIG. 1C) of the gate structure 372, the source or drain region 370 are divided into a region (similar to the region 1446 in FIG. 1C) extended beyond the body structure 364 (shown in FIG. 25A), a region (similar to the region 1444 in FIG. 1C) extended laterally under the gate spacer 374 (shown in FIG. 25A), and a region (similar to the region 1442 in FIG. 1C) formed under and extending a vertical depth of the region extended laterally under the gate spacer 374.

Figure 23:
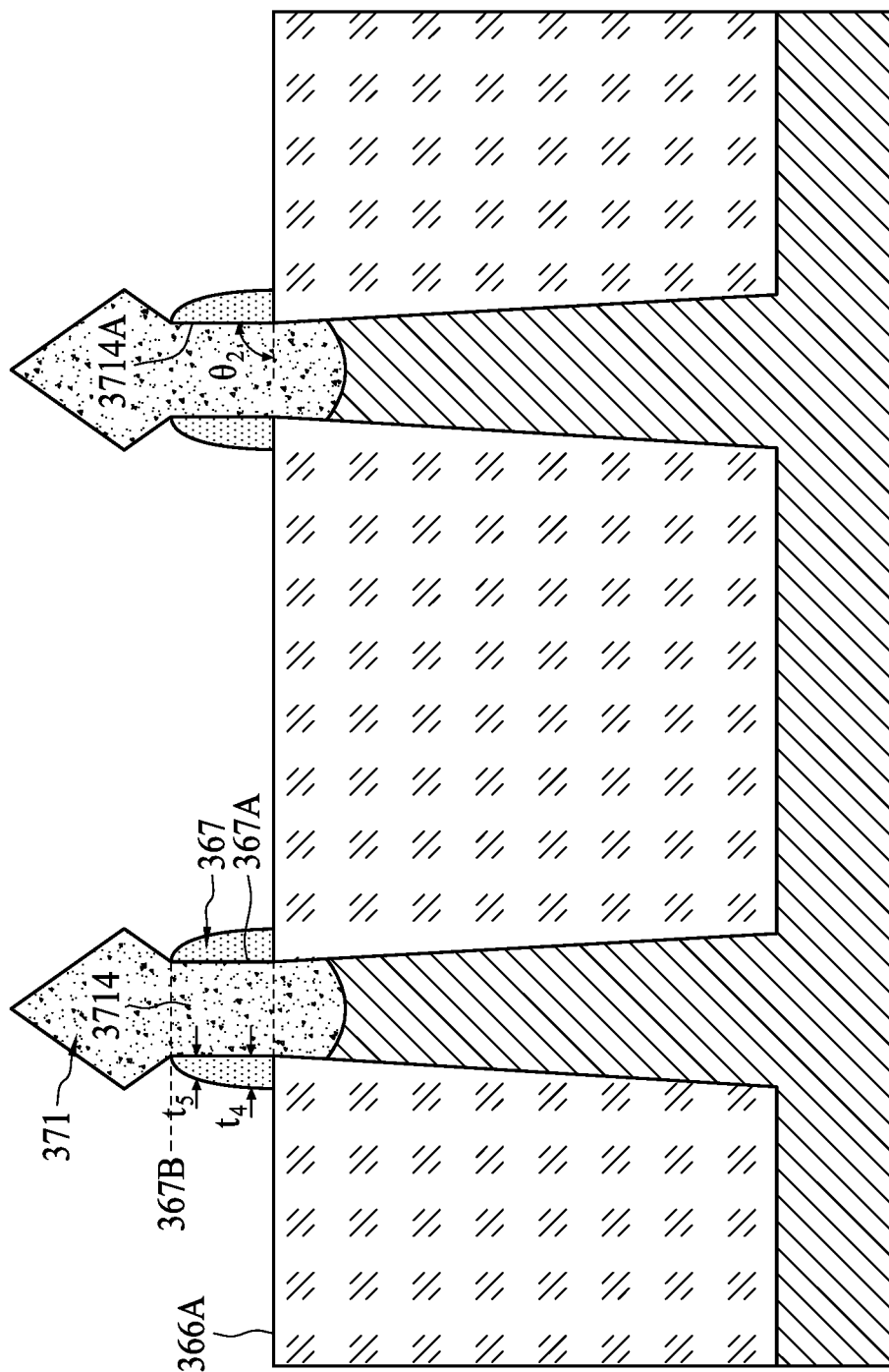
FIG. 23 is a schematic cross-sectional diagram along the same direction as line E-E' in FIG. 20 for illustrating an expitaxially grown source or drain region without a downward tapered region under a facet region.

In comparison, FIG. 23 is a schematic cross-sectional diagram along the same direction as line E-E' in FIG. 20 for illustrating an expitaxially grown source or drain region 371 without a downward tapered region under a facet region. Compared to the fin spacers 368 in FIG. 22, each of the fin spacers 367 in FIG. 23 have substantially the same thickness along a direction from a top 367B of the fin spacers 367 to the first surface 366A. For example, a thickness $t_4$ at a level closer to the surface 366A is substantially the same as a thickness $t_5$ at a level farther away from the first surface 366A. Because the thicknesses of the fin spacer 367 along the direction from the top 367B of the fin spacer 367 to the first surface 366A are substantially unchanged, the stresses exerted at different levels between the top 367B of the fin spacer 367 and the first surface 366A are substantially the same. As a result, side walls 367A of the fin spacers 367 are not tapered when a source or drain recess is formed. When the source or drain region 371 is epitaxially grown, because the side walls 367A of the fin spacers 367 are not tapered, side walls 3714A of the region 3714 between the top 367B of the fin spacers 367 and the first surface 366A are also not tapered. Each of the side walls 3714A has an internal angle $\theta_2$, which is substantially a right angle, with respect to a plane substantially parallel to the first surface 366A. Furthermore, compared to the source or drain region 370 in FIG. 22, because the fin spacers 367 in FIG. 23 are not as wide open for forming a facet region as the fin spacers 368 in FIG. 22, a volume of the source or drain region 371 is smaller than that of the source or drain region 370 in FIG. 22.

Figure 24:
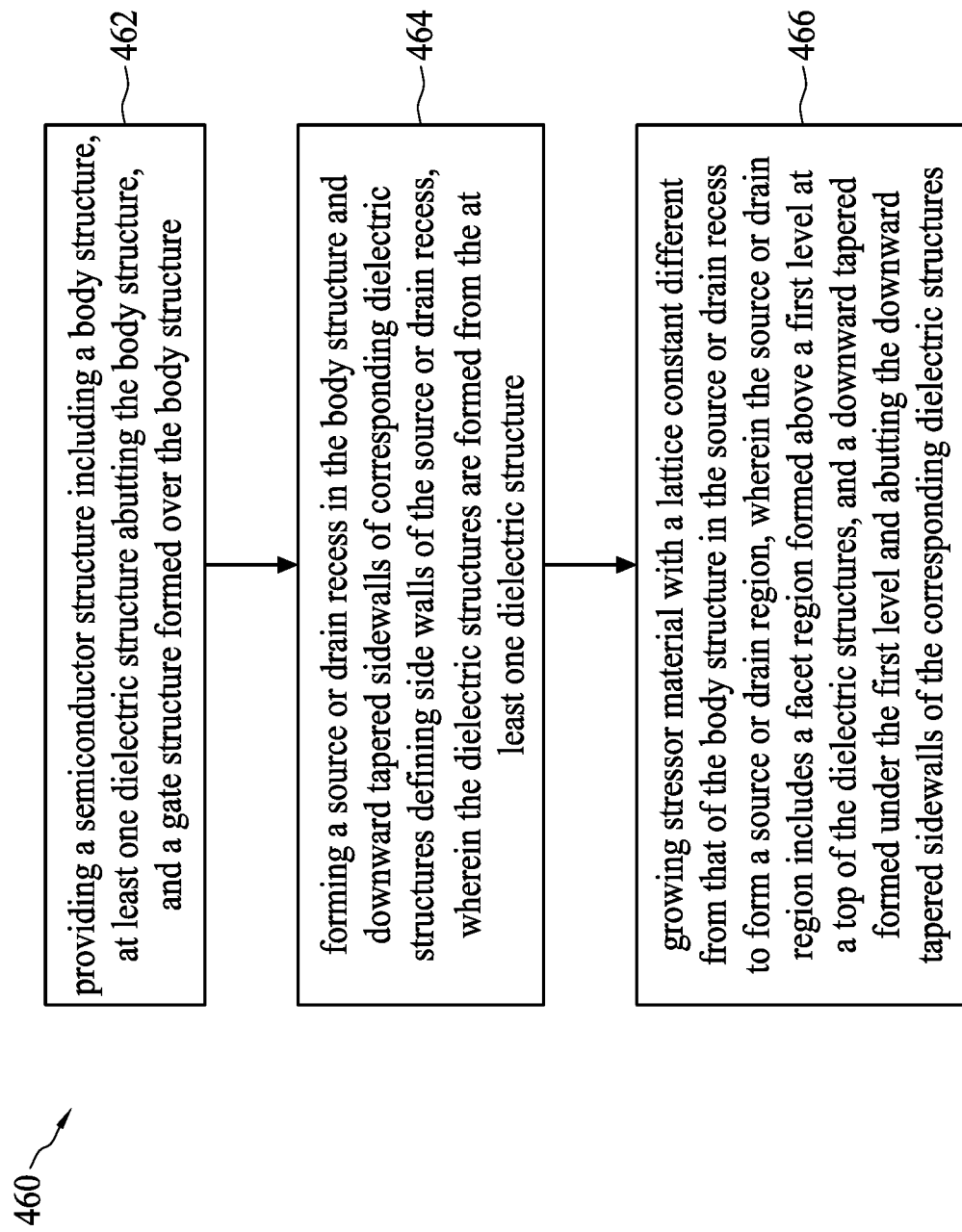
FIG. 24 is a flow diagram of a method for forming the FinFET structures described with references to FIGS. 20 to 22 and FIGS. 26 to 28, respectively, in accordance with some embodiments.

FIG. 24 is a flow diagram of a method for forming the FinFET structures 360 and 660 described and to be described with reference to FIGS. 20 to 22 and FIGS. 26 to 28, respectively, in accordance with some embodiments. In operation 462, a semiconductor structure that includes a body structure, at least one dielectric structure abutting the body structure, and a gate structure formed over the body structure is provided. In operation 464, a source or drain recess in the body structure and downward tapered side walls of corresponding dielectric structures defining side walls of the source or drain recess are formed. The dielectric structures are formed from the at least one dielectric structure. In operation 466, stressor material with a lattice constant different from that of the body structure is grown in the source or drain recess to form a source or drain region. The source or drain region includes a facet region formed above a first level at a top of the dielectric structures, and a downward tapered region formed under the first level and abutting the downward tapered sidewalls of the corresponding dielectric structures.

Figure 25A:
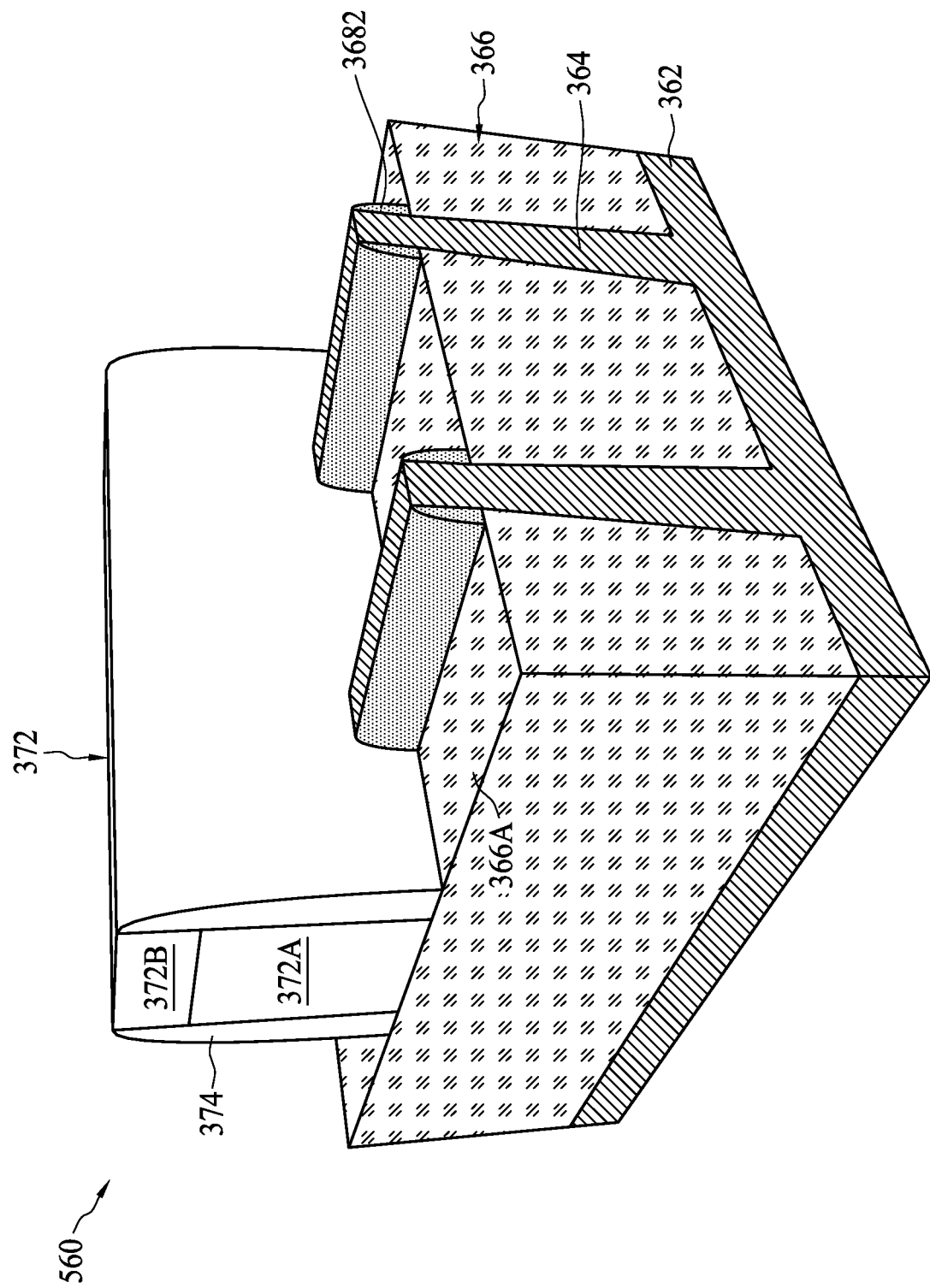
FIG. 25A is a schematic perspective diagram of a semiconductor structure provided in the operation 462 in FIG. 24 in accordance with some embodiments.

FIG. 25A is a schematic perspective diagram of a semiconductor structure 560 provided in the operation 462 in FIG. 24 in accordance with some embodiments. In operation 462, a semiconductor structure 560 that includes a body structure 364, dielectric structures 3682 abutting the body structure 364, and a gate structure 372 formed over the body structure 364 is provided. The semiconductor structure 560 further includes a substrate 362, dielectric isolation regions 366 and gate spacers 374. The substrate 362, the dielectric isolation regions 366, the body structure 364 and the gate structure 372 of the semiconductor structure 560 are formed similarly as the substrate 112, the dielectric isolation regions 114, the body structure 322 and the sacrificial gate structure 322 in FIG. 3A, respectively, except two fins of the body structure 364 are shown in FIG. 25A, and one fin of the body structure 322 is shown in FIG. 3A. The gate structure 372 includes a sacrificial gate electrode 372A and a hard mask 372B which are formed similarly as the sacrificial gate electrode 3322 and the hard mask 3324 of the sacrificial gate structure 322 described with references to FIGS. 3B and 3C. The gate spacer 374 is formed similarly as the spacer 3344 described with reference to FIG. 4.

Compared to the semiconductor structure 30 in FIG. 3A, the semiconductor structure 560 in FIG. 25A includes the dielectric structures 3682 formed over a first surface 366A at the level of the top surfaces of the dielectric isolation regions 366. In some embodiments, the dielectric structures 3682 abut side walls of portions of the body structure 364 extended beyond the first surface 366A and located beside the gate structure 372. Exemplary materials for forming the dielectric structures 3682 have been provided with reference to FIG. 21. In some embodiments, the dielectric structures 3682 are a first layer of fin spacers. To form the first layer of fin spacers, a dielectric layer is blanket deposited over the first surface 366A and the body structure 364 by, for example, chemical vapor deposition (CVD). Then, the dielectric layer is etched anisotropically to remove portions of the dielectric layer over the first surface 366A, and top surfaces of the body structure 364.

Figure 25B:
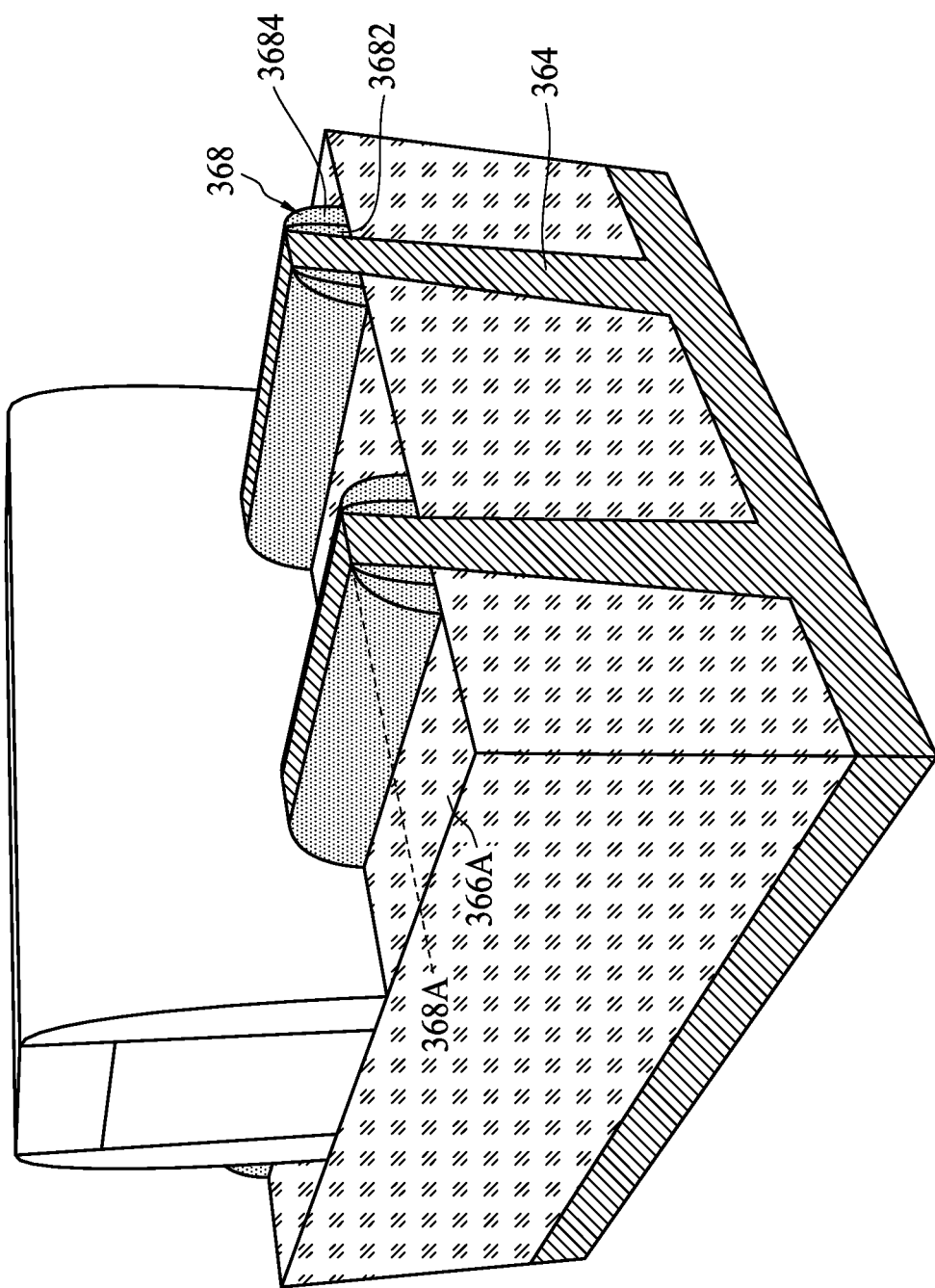
FIG. 25B is a schematic perspective view diagram illustrating at least one additional dielectric layer formed over the dielectric structures in accordance with some embodiments.
Figure 25C:
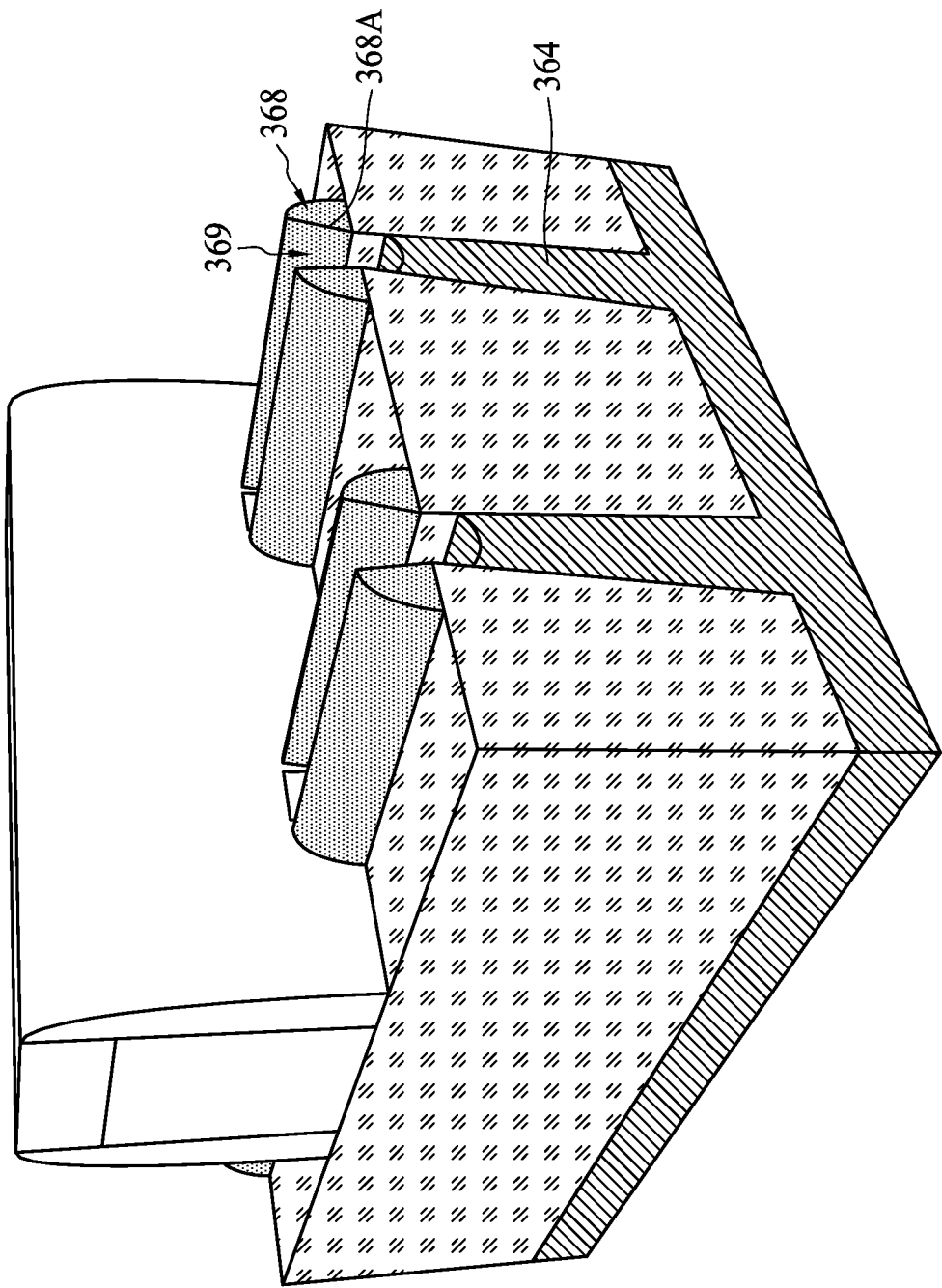
FIG. 25C is a schematic perspective view diagram illustrating the dielectric structures formed of downward tapered side walls and a source and drain recess defined by the downward tapered side walls in accordance with some embodiments.

FIG. 25B is a schematic perspective view diagram illustrating at least one additional dielectric layer 3684 formed over the dielectric structures 3682 in accordance with some embodiments. FIG. 25C is a schematic perspective view diagram illustrating the dielectric structures 368 formed of downward tapered side walls 368A and a source and drain recess 369 defined by the downward tapered side walls 368A in accordance with some embodiments. Referring to FIG. 25C, in operation 464, the source or drain recess 369 in the body structure 364 and the downward tapered side walls 368A of the corresponding dielectric structures 368 defining side walls of the source or drain recess 369 are formed. In some embodiments, the operation 464 includes as shown in FIG. 25B, an operation 4642 in which at least one additional dielectric layer 3684 is formed over the dielectric structures 3682, and as shown in FIG. 25C, an operation 4644 in which the source or drain recess 369 in the body structure 364 and the downward tapered side walls 368A of the corresponding dielectric structures 368 are formed.

Referring to FIG. 25B, in some embodiments, in the operation 4642, the additional dielectric layer 3684 is at least one second layer of fin spacers formed over the first layer of fin spacers. To form the second layer of fin spacers, a dielectric layer is blanket deposited over the first surface 366A, the dielectric structures 3682 and the top surfaces of the body structure 364. Then, the dielectric layer is etched anisotropically to remove portions of the dielectric layer over the first surface 366A and the top surfaces of the body structure 364 to form the dielectric layer 3684. Therefore, the dielectric structures 368 which have gradually increased thickness from a top 368A of the dielectric structure 368 to the first surface 366A are created.

Referring to FIG. 25C, in some embodiments, in the operation 4644, the source or drain recess 369 is formed in the body structure 364. As described with reference to FIG. 21, because a portion of the body structure 364 (as shown in FIG. 25B) against the side walls 368A of the corresponding dielectric structures 368 are removed, differences in thickness of the dielectric structures 368 cause the side walls 368A of the corresponding dielectric structures 368 to be downward tapered. In some embodiments, the source or drain recess 369 is formed using the operations 206 and 208 described with reference to FIGS. 2, 5 to 7.

In other embodiments, in the operation 462, the at least one dielectric structure (not shown) is a first dielectric layer blanket deposited over the first surface 366A and the body structure 364. In the operation 464, at least one second dielectric layer (not shown) is blanket deposited over the first dielectric layer, and the first dielectric layer and the at least one second dielectric layer are etched anisotropically to form the dielectric structures 368.

Referring to FIG. 20, in operation 466, stressor material with a lattice constant different from that of the body structure 364 is grown in the source or drain recess 369 (shown in FIG. 25C) to form a source or drain region 370. Referring to FIG. 22, the source or drain region 370 includes a facet region 3702 formed above a first level at a top 368B of the dielectric structures 368 and a downward tapered region 3704 formed under the first level and abutting the downward tapered sidewalls 368A of the corresponding dielectric structures 368. In some embodiments, the growth of the stressor material is similar to the embodiments described with reference to FIG. 8.

Figure 26:
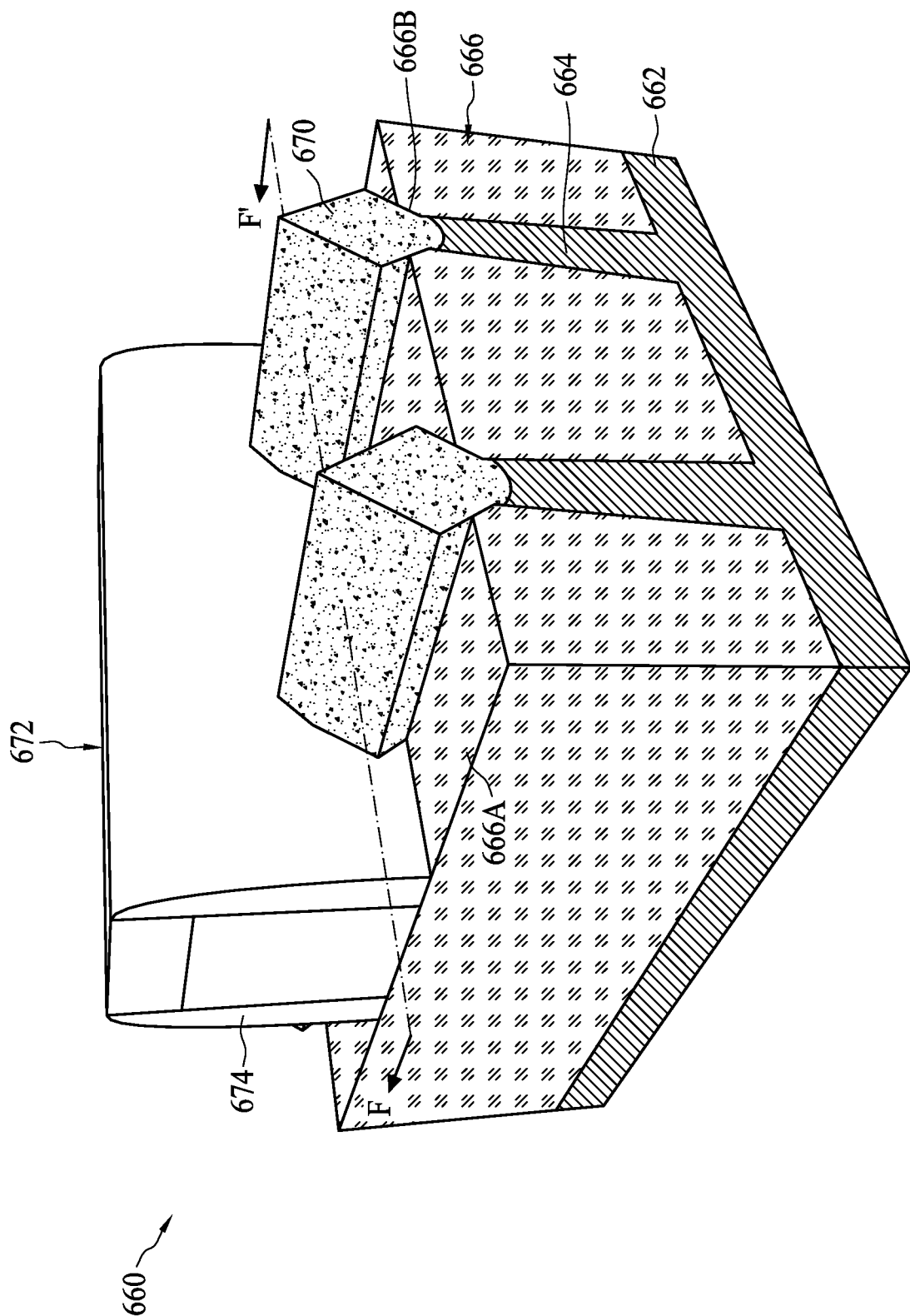
FIG. 26 is a schematic perspective diagram of a FinFET structure having a source or drain region containing epitaxially grown stressor material in accordance with other embodiments.

FIG. 26 is a schematic perspective diagram of a FinFET structure 660 having a source or drain region 670 containing epitaxially grown stressor material in accordance with other embodiments. Compared to the FinFET structure 360 in FIG. 20, dielectric isolation regions 666 of the FinFET structure 660 have downward tapered sidewalls 666B that define a source or drain recess 669 (shown in FIG. 27) in which the source or drain region 670 is to be grown. The FinFET structure 660 includes a substrate 662, a body structure 664, the dielectric isolation regions 666, a gate structure 672, gate spacers 674 and the source or drain region 670. The substrate 662, the body structure 664, the gate structure 672 and the gate spacers 674 are similar to the substrate 362, the body structure 364, the gate structure 372 and the gate spacers 374 described with reference to FIG. 20, and are omitted here.

Referring to FIG. 26, top surfaces of the dielectric isolation regions 666 form a first surface 666A. The first surface 666A is substantially aligned with a bottom of the gate structure 672 similar to the first surface 366A described with reference to FIG. 20.

Figure 27:
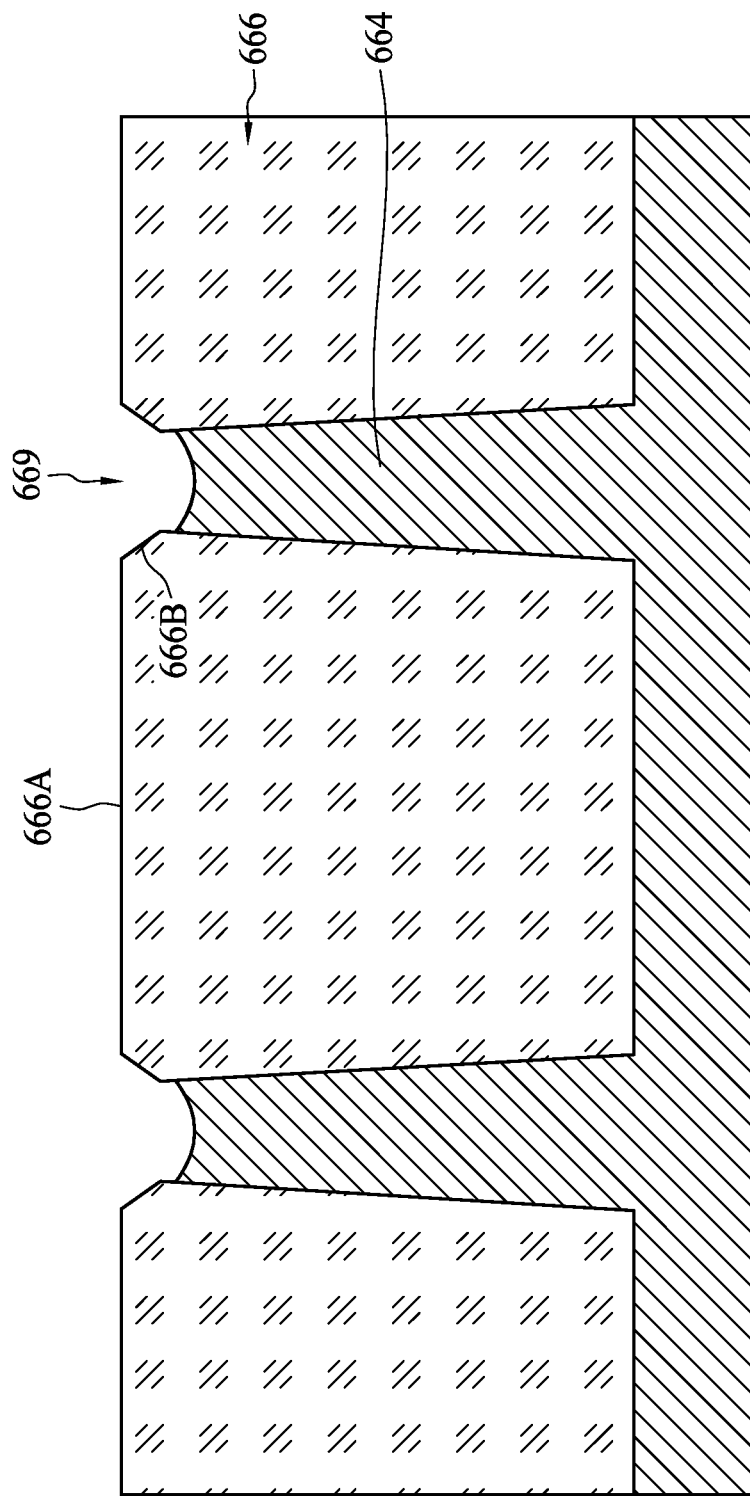
FIG. 27 is a schematic cross-sectional diagram along line F-F' in FIG. 26 for illustrating the dielectric isolation regions in accordance with some embodiments.

Before a source or drain recess 669 (shown in FIG. 27) is formed in the body structure 664, the dielectric isolation regions 666 abut sidewalls of portions of the body structure 664 under the first surface 666A and to be replaced by the source or drain region 670. The dielectric isolation regions 666 at this stage is similar to the illustrated dielectric isolation regions 366 in FIG. 25A. FIG. 27 is a schematic cross-sectional diagram along line F-F' in FIG. 26 for illustrating the dielectric isolation regions 666 in accordance with some embodiments. In FIG. 27, the source or drain recess 669 is formed in the body structure 664. Furthermore, sharp corners 666D (shown in FIG. 29C) of the dielectric isolation regions 666 formed by the first surface 666A and sidewalls 666C of the dielectric isolation regions 666 abutting the body structure 664 are beveled. Therefore, the sidewalls 666B (shown in FIG. 27) of the dielectric isolation regions 666 that define the source or drain recess 669 are downward tapered. Exemplary materials for forming the dielectric isolation regions 666 are similar to those of the dielectric isolation regions 366 described with reference to FIG. 20 and are omitted.

Referring to FIG. 26, the source or drain region 670 is formed by epitaxially growing stressor material in the source or drain recess 669 shown in FIG. 27. Therefore, the source or drain region 670 is embedded in the body structure 664 beside the gate structure 672. Furthermore, the epitaxially grown source or drain region 670 extends beyond the first surface 666A. Exemplary stressor materials and doping of the source or drain region 670 have been provided with reference to FIG. 20.

Figure 28:
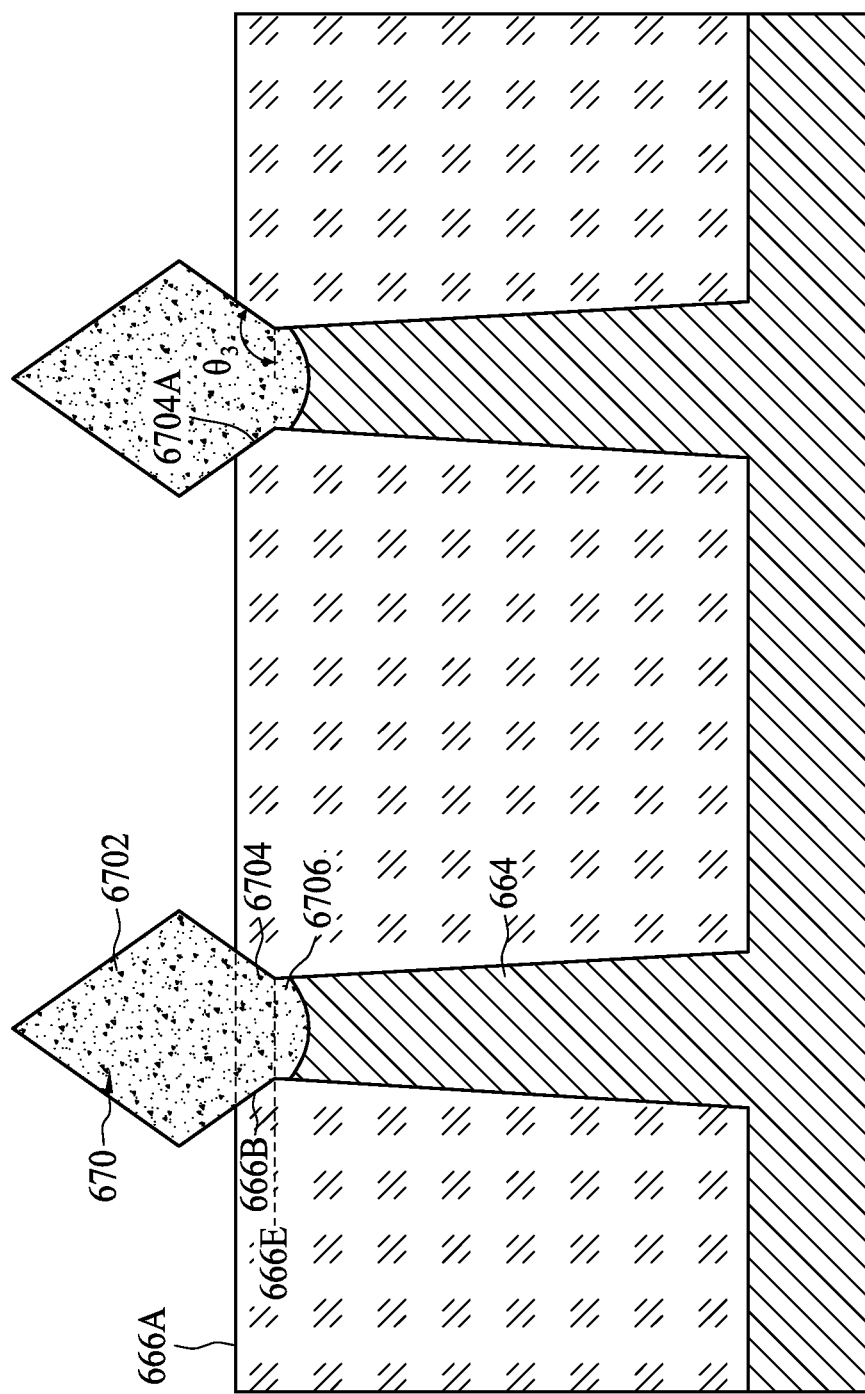
FIG. 28 is a schematic cross-sectional diagram along line F-F' in FIG. 26 for illustrating the epitaxially grown source or drain region with a downward tapered region 6704 under a facet region in accordance with some embodiments.

FIG. 28 is a schematic cross-sectional diagram along line F-F' in FIG. 26 for illustrating the epitaxially grown source or drain region 670 with a downward tapered region 6704 under a facet region 6702 in accordance with some embodiments. The source or drain region 670 includes the facet region 6702, the downward tapered region 6704 and may further include a less tapered region 6706. Because epitaxial growth is not confined above the first surface 666A, and the difference in growth rates of the different planes as described with reference to FIG. 22, the facet region 6702 that has a shape similar to a rhombus shape is formed.

Under the facet region 6702, the downward tapered region 6704 that abuts the downward tapered side walls 666B is formed. The downward tapered region 6704 exists between the first surface 666A and a bottom level 666C of the tapered side walls 666B under the first surface 666A. Because of the downward tapered side walls 666B of the dielectric isolation regions 666, the region 6704 grown therebetween also have downward tapered side walls 6704A. In some embodiments, each of the side walls 6704A has an internal angle $\theta_3$ with respect to a plane substantially parallel to the first surface 666A. The internal angle $\theta_3$ is above 90° and below 180°. Because of the downward tapered side walls 666B, the dielectric isolation regions 666 open more widely at the level of the first surface 666A to receive the stressor material, and therefore expands a base where the facet region 6702 grows from. As a result, a volume of the source or drain region 670 is increased. The larger the volume of the source or drain region 670 that contains the stressor material is, the higher the magnitude of the mechanical stress applied to a channel region from the source or drain region 670 is, and therefore, the more enhanced the carrier mobility in the channel region is.

In some embodiments, the region 6706 between the downward tapered region 6704 and the remaining body structure 664 has less tapered side walls compared to the region 6704. In some embodiments, the regions 6702, 6704 and 6706 divide the source or drain region 670 along a direction substantially parallel to a width $W_{g1}$ (shown in FIG. 1B) of the gate structure 672. In some embodiments, along a direction substantially parallel to a length $L_{g1}$ (shown in FIG. 1C) of the gate structure 672, the source or drain region 670 are divided into a region (similar to the region 1446 in FIG. 1C) extended beyond the body structure 664 (shown in FIG. 29A), a region (similar to the region 1444 in FIG. 1C) extended laterally under the gate spacer 674 (shown in FIG. 29A), and a region (similar to the region 1442 in FIG. 1C) formed under and extending a vertical depth of the region extended laterally under the gate spacer 674.

Figure 29A:
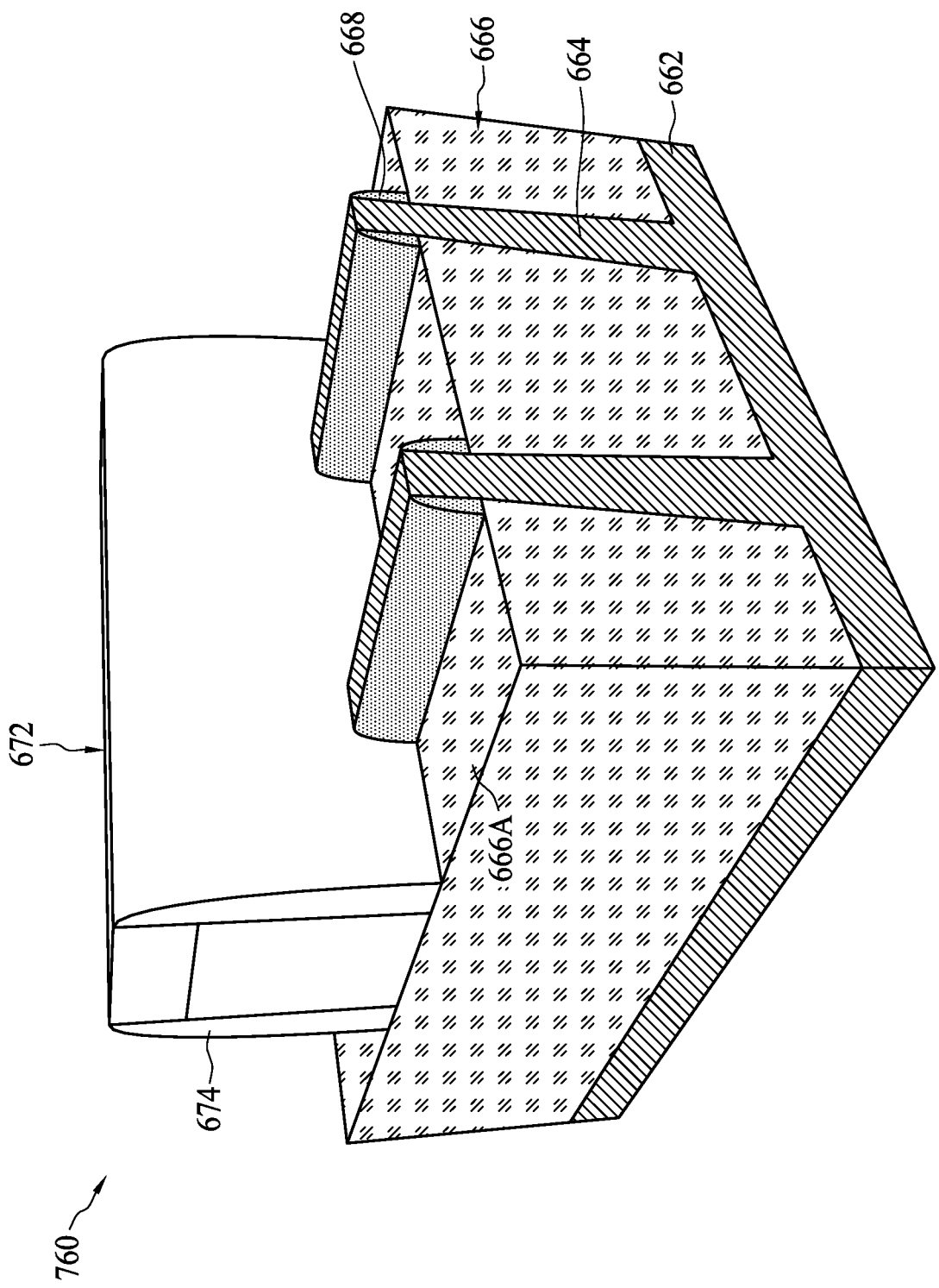
FIG. 29A is a schematic perspective diagram of a semiconductor structure provided in the operation 462.

In FIG. 24, the flow diagram of the method for forming the FinFET structure 660 described with reference to FIGS. 26 to 28 has been provided. FIG. 29A is a schematic perspective diagram of a semiconductor structure 760 provided in the operation 462. In operation 462, a semiconductor structure 760 that includes a body structure 664, dielectric structures 666 abutting the body structure 664, and a gate structure 672 formed over the body structure 664 is provided. Compared to the operation 462 for providing the semiconductor structure 560 described with reference to FIG. 25A, the dielectric structures 666 in the operation 462 for providing the semiconductor structure 760 are the dielectric isolation regions. The semiconductor structure 760 in FIG. 29A is similar to the semiconductor structure 560 in FIG. 25A and is omitted to be further described here.

Figure 29B:
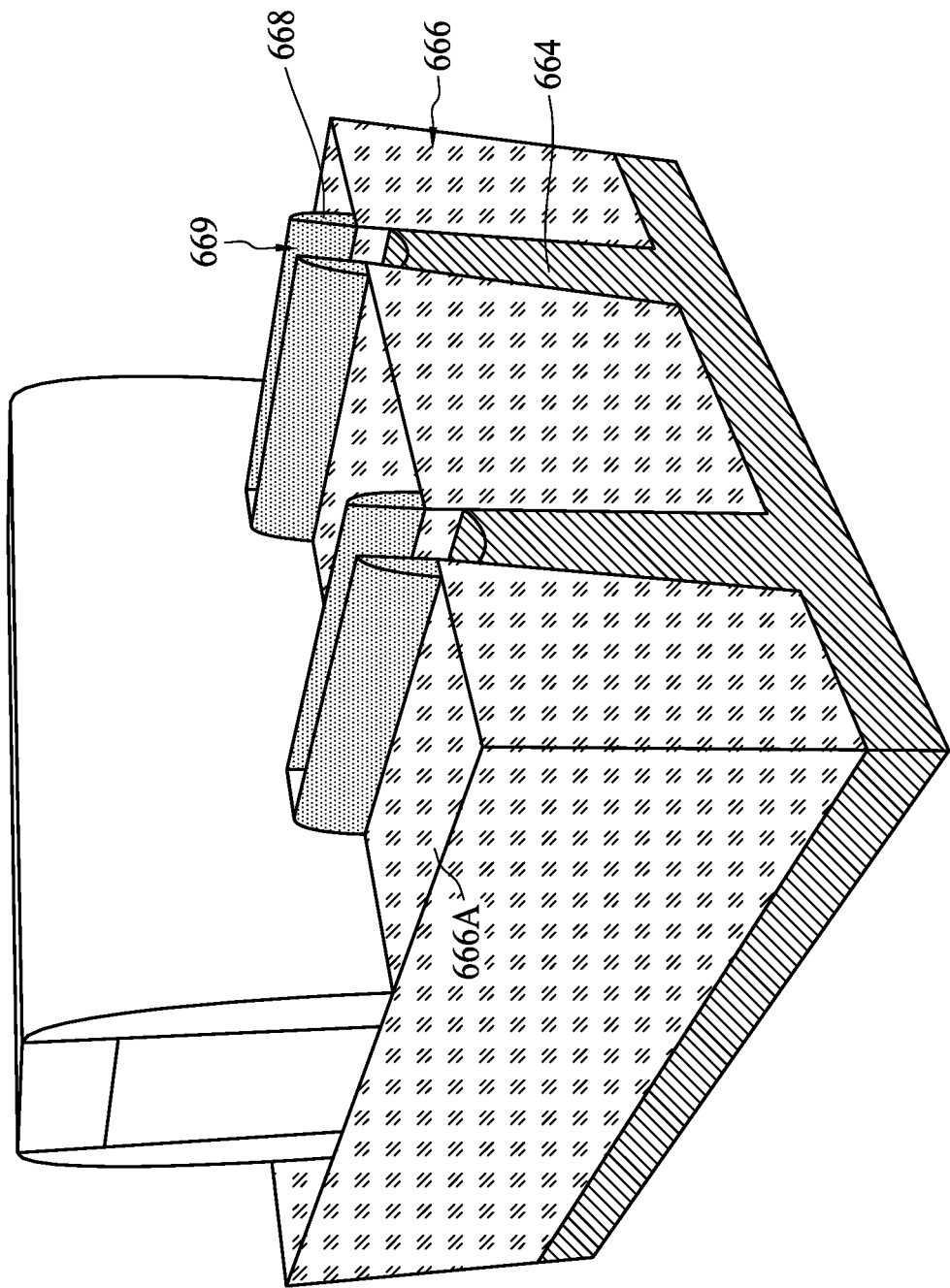
FIG. 29B is a schematic perspective diagram illustrating a source and drain recess formed in the body structure before downward tapered sidewalls of the dielectric structures are formed in accordance with some embodiments.
Figure 29C:
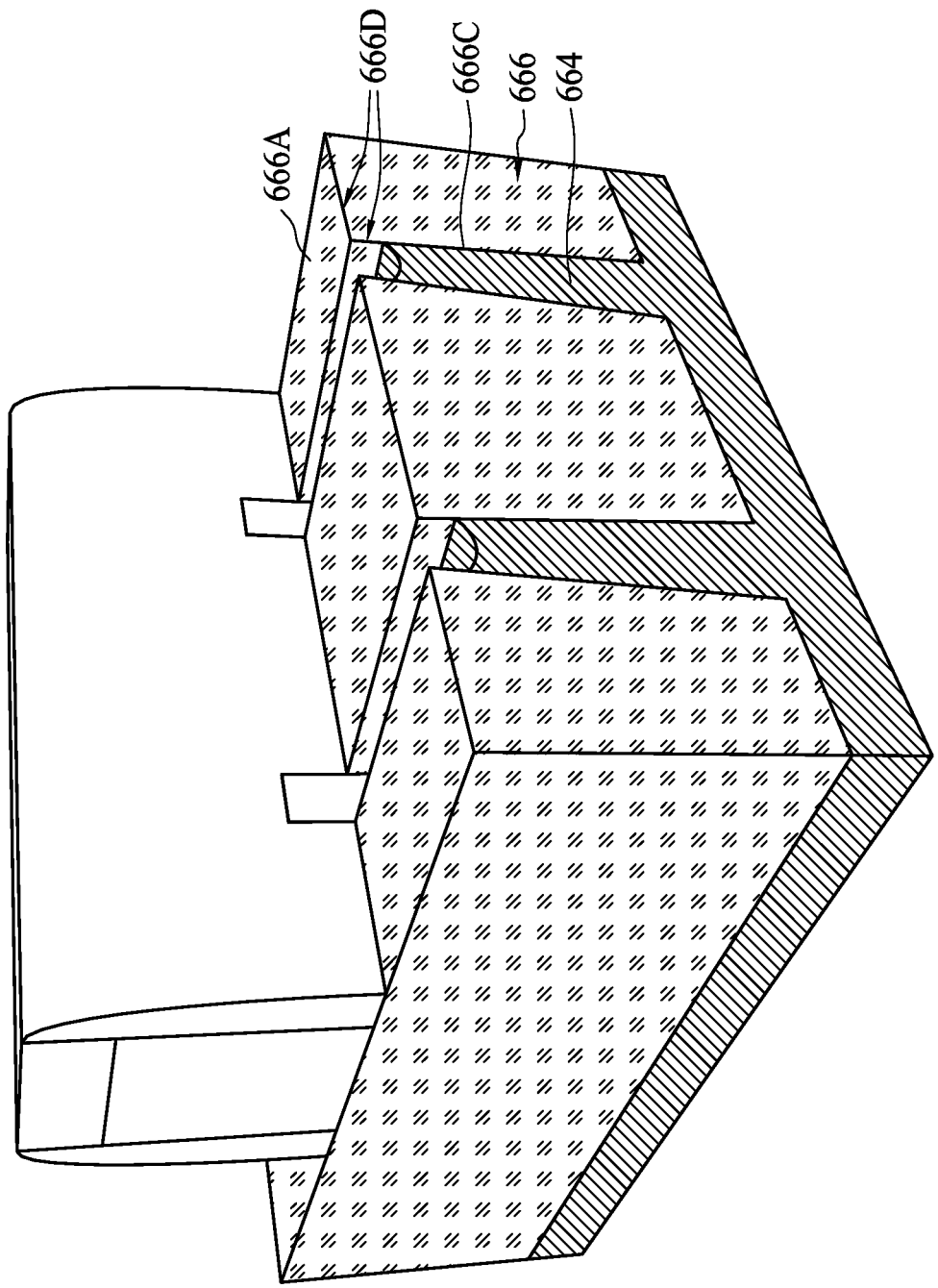
FIG. 29C is a schematic perspective diagram illustrating the removal of the fin spacers in FIG. 29B in accordance with some embodiments.
Figure 29D:
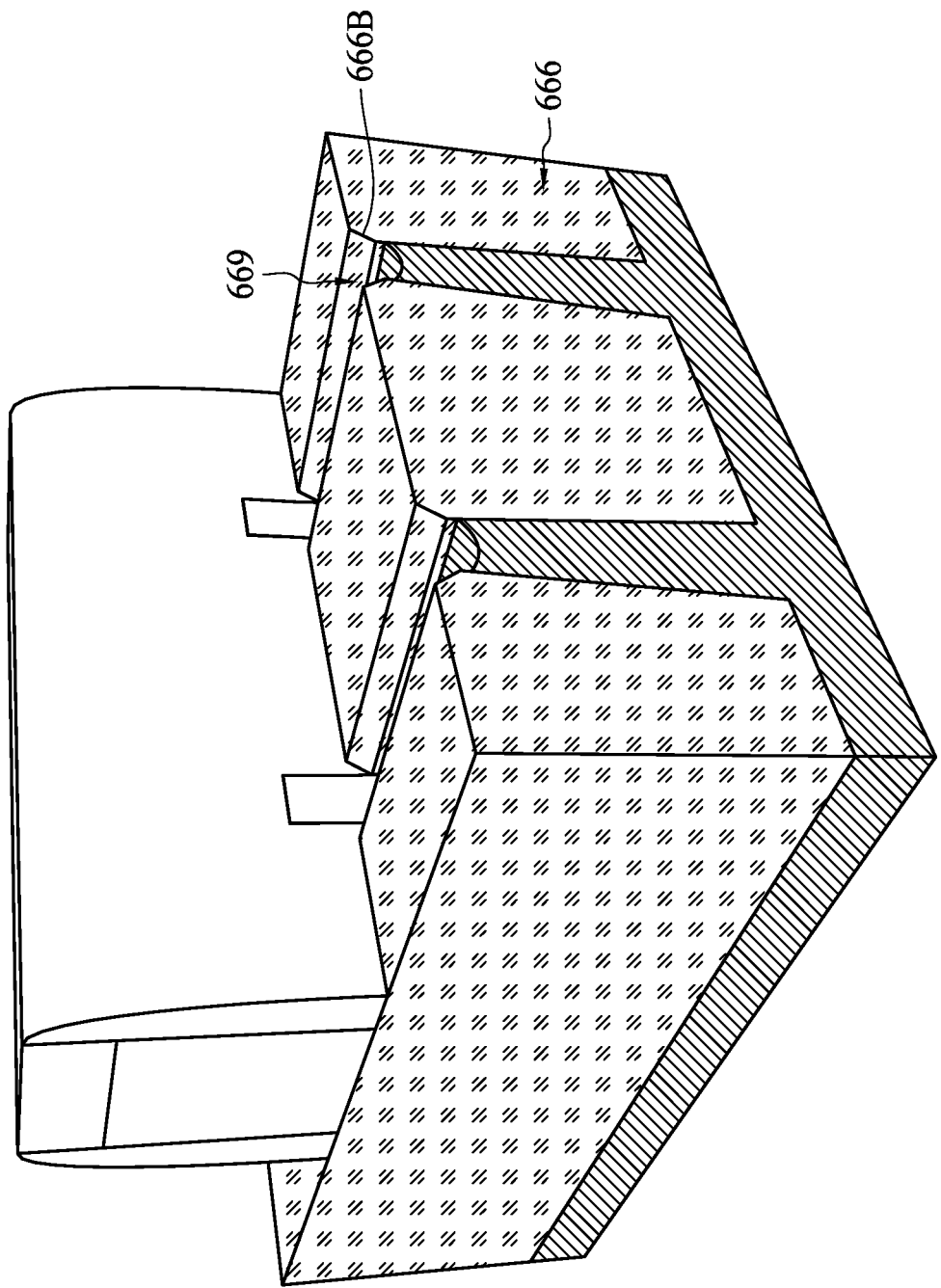
FIG. 29D is a schematic perspective diagram illustrating the dielectric structure formed of the downward tapered side walls and the source or drain recess defined by the downward tapered side walls in accordance with some embodiments.

FIG. 29B is a schematic perspective diagram illustrating a source and drain recess 669 formed in the body structure 664 before downward tapered sidewalls 666B (shown in FIG. 26) of the dielectric structures 666 are formed in accordance with some embodiments. FIG. 29C is a schematic perspective diagram illustrating the removal of the fin spacers 668 in FIG. 29B in accordance with some embodiments. FIG. 29D is a schematic perspective diagram illustrating the dielectric structure 666 formed of the downward tapered side walls 666B and the source or drain recess 669 defined by the downward tapered side walls 666B in accordance with some embodiments. In operation 464, as shown in FIG. 29B, the source or drain recess 669 in the body structure 664 is formed, and as shown in FIG. 29C, the downward tapered side walls 666B of the corresponding dielectric structures 666 defining side walls of the source or drain recess 669 are formed. In some embodiments, the operation 464 includes as shown in FIG. 29B, an operation 4646 in which the source or drain recess 669 is formed in the body structure 664, and as shown FIG. 29C, an operation 4648 in which the fin spacers 668 (shown in FIG. 29B) formed over the first surface 666A are removed, and as shown in FIG. 29D, an operation 4650 in which a portion of each of the dielectric structures 666 is removed to form the downward tapered sidewalls 666B of the dielectric structures 666.

Referring to FIG. 29B, in some embodiments, in operation 4646, the source or drain recess 669 is formed in the body structure 664. The source or drain recess 669 is formed similarly as the operation 4644 described with reference to FIG. 25C and is omitted here.

Referring to FIG. 29C, in some embodiments, in operation 4648, the fin spacers 668 (shown in FIG. 29B) formed over the first surface 666A are removed. As a result, sharp corners 666D of the dielectric structures 666 formed by the first surface 666A and side walls 666C of the dielectric structures 666 abutting the body structure 664 are exposed.

Referring to FIG. 29D, in some embodiments, in operation 4650, the sharp corners 666D (shown in FIG. 29C) of the dielectric structures 666 are beveled to form downward tapered sidewalls 666B of the dielectric structures 666 that define the source or drain recess 669. In some embodiments, the sharp corners 666D are beveled using operations including a main etching operation that forms a rough profile of a portion of the recess 669 corresponding to the downward tapered region 6704 (shown in FIG. 28), and an over etching operation that forms a profile with the desired angle $\theta_3$ and a portion of the recess 699 corresponding to the less tapered region 6706 (shown in FIG. 28). In some embodiments, the main etch operation and the over etching operation use a pressure of 1 to 50 mTorr, a power of 100 to 1000 W, a gas chemistry selected from a group consisting of HBr, $Cl_2$, $SF_6$, $N_2$, $CF_4$, $CHF_3$, $CH_4$, $CH_2F_2$, $N_2H_2$, $O_2$, He, and Ar, and a temperature of 10° C. to 65° C.

Referring to FIG. 26, in operation 466, stressor material with a lattice constant different from that of the body structure 664 is grown in the source or drain recess 669 (shown in FIG. 29D) to form a source or drain region 670. Referring to FIG. 28, the source or drain region 670 includes a facet region 6702 formed above a first level at a top (corresponding to the first surface 666A) of the dielectric structures 666 and a downward tapered region 6704 formed under the first level abutting the downward tapered sidewalls 666B of the corresponding dielectric structures 666. The growth of the stressor material in the source or drain recess 669 is similar to the growth of the stressor material in the source or drain recess 369 described with reference to FIG. 20. Because the fin spacers 668 (shown in FIG. 29B) are removed, non-uniformity in the source or drain region 670 grown due to the effects of variations in top levels of the fin spacers 668 is improved. Therefore, device performance uniformity is enhanced.

Some embodiments have one or a combination of the following features and/or advantages. In some embodiments, in an FET structure, a source or drain region embedded in a body structure besides a gate structure and abutting and extended beyond dielectric structures is formed. The source or drain region contains stressor material with a lattice constant different from that of the body structure. The source or drain region includes a facet region formed above a first level at a top of the dielectric structures and a downward tapered region formed under the first level and abutting the corresponding dielectric structures. The dielectric structures abutting the downward tapered region of the source or drain region also include downward tapered side walls. Because of the downward side walls, the dielectric structures open more widely at the first level to receive the stressor material, and therefore expand a base where the facet region grows from. As a result, a volume of the source or drain region is increased. The larger the volume of the source or drain region that contains the stressor material is, the higher the magnitude of the mechanical stress applied to the channel region from the source or drain region is, and therefore, the more enhanced the carrier mobility in the channel region is. Furthermore, in some embodiments, fin spacers are removed and the downward tapered side walls for defining the source or drain recess are formed in dielectric isolation regions. Therefore, non-uniformity in the source or drain region grown due to the effects of variations in top levels of the fin spacers is improved. As a result, device performance uniformity is enhanced.

In some embodiments, a field effect transistor (FET) structure comprises a body structure, dielectric structures, a gate structure and a source or drain region. The gate structure is formed over the body structure. The source or drain region is embedded in the body structure beside the gate structure, and abuts and is extended beyond the dielectric structure. The source or drain region contains stressor material with a lattice constant different from that of the body structure. The source or drain region comprises a first region formed above a first level at a top of the dielectric structures and a second region that comprises downward tapered side walls formed under the first level and abutting the corresponding dielectric structures.

In some embodiments, a field effect transistor (FET) structure comprises a body structure, a gate structure formed over the body structure and a source or drain region. The gate structure is formed over the body structure. The source or drain region is embedded in the body structure beside the gate structure, and abuts and is extended beyond the body structure. The source or drain region contains stressor material with a lattice constant different from that of the body structure. The source or drain region comprises a first region that comprises facets and a second region that comprises downward tapered sidewalls under the first region.

In some embodiments, in a method, a semiconductor structure comprising a body structure, at least one dielectric structure abutting the body structure, and a gate structure formed over the body structure is provided. A source or drain recess in the body structure and downward tapered sidewalls of corresponding dielectric structures defining side walls of the source or drain recess are formed. The dielectric structures are formed from the at least one dielectric structure. Stressor material with a lattice constant different from that of the body structure is grown in the source or drain recess to form a source or drain region. The source or drain region comprises a first region formed above a first level at a top of the dielectric structures, and a second region formed under the first level and abutting the downward tapered side walls of the dielectric structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor structure comprising a body structure;
   forming a gate structure over the body structure;
   forming a pair of dielectric structures abutting the body structure, so that a portion of the body structure is sandwiched between the pair of dielectric structures;

removing at least the portion of the body structure;
removing the pair of dielectric structures; and
growing stressor material with a lattice constant different from that of the body structure in a source or drain recess to form a source or drain region.

2. The method of claim 1, wherein the body structure is a fin structure.

3. The method of claim 2, wherein forming the gate structure over the body structure comprises:
forming the gate structure to wrap around a channel region of the body structure, wherein a first surface is leveled with a bottom of the gate structure.

4. The method of claim 3, wherein forming the pair of dielectric structures abutting the body structure comprises:
forming the pair of dielectric structures above the first surface, wherein the pair of dielectric structures are thicker towards the first surface and thinner away from the first surface.

5. The method of claim 1, wherein the removal of at least the portion of the body structure comprises:
removing the body structure above the first surface; and
removing a portion of the body structure below the first surface.

6. The method of claim 3, wherein a thickness of each of the dielectric structures at a level of the first surface is in a range of about 0.1 nm to about 200 nm.

7. The method of claim 4, wherein the source or drain region comprises:
a facet region above the first surface.

8. A method, comprising:
providing a semiconductor structure comprising a fin structure protruding from a substrate;
forming dielectric isolation regions on the substrate and surrounding the fin structure, the dielectric isolation regions having a first surface;
forming a gate structure over the dielectric isolation regions and the fin structure;
forming a pair of fin spacers abutting the fin structure, so that a portion of the fin structure is sandwiched between the pair of fin spacers;
removing at least the portion of the fin structure and the pair of fin spacers to define a source or drain recess; and
growing stressor material with a lattice constant different from that of the fin structure in the source or drain recess to form a source or drain region, wherein a top surface of the dielectric isolation region is substantially aligned with a bottom of the gate structure.

9. The method of claim 8, wherein forming the gate structure over the dielectric isolation regions and the fin structure comprises:
forming the gate structure over the dielectric isolation regions and the fin structure to wrap around a channel region of the fin structure.

10. The method of claim 8, wherein the removal of the pair of fin spacers comprises:
removing the pair of fin spacers to expose sharp corners of the dielectric isolation regions.

11. The method of claim 10, further comprising:
removing a portion of the dielectric isolation regions at the sharp corners to form downward tapered sidewalls.

12. The method of claim 11, wherein the growth of the stressor material comprises:
growing the stressor material after removal of the portion of the dielectric isolation regions.

13. The method of claim 8, wherein the source or drain region comprises:
a facet region;
a downward tapered region below the facet region; and
a less tapered region below the downward tapered region wherein a bottom of the facet region is leveled with a bottom of the gate structure.

14. The method of claim 13, wherein the facet region has a rhombus shape.

15. A method, comprising:
providing a semiconductor structure comprising a fin structure protruding from a substrate;
forming dielectric isolation regions on the substrate and surrounding the fin structure, the dielectric isolation regions having a first surface;
forming a gate structure over the dielectric isolation regions and the fin structure;
forming a pair of fin spacers abutting the fin structure, so that a portion of the fin structure is sandwiched between the pair of fin spacers; and
removing at least the portion of the fin structure and the pair of fin spacers to form a recess.

16. The method of claim 15, wherein forming the gate structure over the dielectric isolation regions and the fin structure comprises:
forming the gate structure over the dielectric isolation regions and the fin structure to wrap around a channel region of the fin structure.

17. The method of claim 16, wherein forming the pair of fin spacers abutting the fin structure comprises:
forming the pair of fin spacers above the first surface, wherein the pair of fin spacers are thicker towards the first surface and thinner away from the first surface.

18. The method of claim 15, wherein removing at least the portion of the fin structure comprises:
removing the fin structure above the first surface; and
removing a portion of the fin structure below the first surface.

19. The method of claim 15, wherein a portion of a bottom of the gate structure is in contact with the top surface of the dielectric isolation regions.

20. The method of claim 15, further comprising:
removing a portion of the dielectric isolation regions to form downward tapered sidewalls.

* * * * *